United States Patent
Kondo

(10) Patent No.: US 10,536,112 B2
(45) Date of Patent: Jan. 14, 2020

(54) OSCILLATOR AND ELECTRONIC APPARATUS

(71) Applicant: SEIKO EPSON CORPORATION, Tokyo (JP)

(72) Inventor: Manabu Kondo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/968,975

(22) Filed: May 2, 2018

(65) Prior Publication Data
US 2018/0337634 A1  Nov. 22, 2018

(30) Foreign Application Priority Data

May 18, 2017 (JP) ................................. 2017-098737
Oct. 25, 2017 (JP) ................................. 2017-205859

(51) Int. Cl.
| | |
|---|---|
| *H03B 5/04* | (2006.01) |
| *H01L 41/053* | (2006.01) |
| *H01L 41/047* | (2006.01) |
| *H03B 5/32* | (2006.01) |

(52) U.S. Cl.
CPC ............ *H03B 5/04* (2013.01); *H01L 41/047* (2013.01); *H01L 41/053* (2013.01); *H03B 5/32* (2013.01)

(58) Field of Classification Search
CPC ........................................................ H03B 5/04
USPC ........................................................... 331/70
See application file for complete search history.

(56) References Cited

U.S. PATENT DOCUMENTS

| | | | |
|---|---|---|---|
| 9,468,105 B2 | 10/2016 | Kondo | |
| 2006/0192626 A1* | 8/2006 | Milliren | H03B 5/04 331/158 |
| 2009/0212875 A1* | 8/2009 | Makinwa | H03B 17/00 331/34 |

FOREIGN PATENT DOCUMENTS

| | | |
|---|---|---|
| JP | 2015-186128 A | 10/2015 |
| JP | 2017-28360 A | 2/2017 |

* cited by examiner

*Primary Examiner* — Joseph Chang
(74) *Attorney, Agent, or Firm* — Oliff PLC

(57) ABSTRACT

An oscillator includes a container, a first heater disposed in a first area of the container, a second heater disposed in a second area of the container that is different from the first area, a vibrator disposed between the first area and the second area when viewed in the direction perpendicular to a surface on which the first heater is disposed, and a layer that is disposed between the vibrator and the container with at least part of the layer overlapping with the first heater, the second heater, and the vibrator when viewed in the direction perpendicular to the surface on which the first heater is disposed, and the thermal conductivity of the layer is higher than the thermal conductivity of the first and second areas.

9 Claims, 18 Drawing Sheets

OSCILLATOR AND ELECTRONIC APPARATUS

BACKGROUND

1. Technical Field

The present invention relates to an oscillator and an electronic apparatus.

2. Related Art

As an example of an electronic device, there has been a known vibrator device (electronic part) having a stabilized resonance frequency by heating a vibrator, a container, and other components to stabilize the temperature of the vibrator. For example, JP-A-2015-186128 discloses a vibrator device (electronic part) having a configuration in which an end portion of a vibrator element is mounted on a heat generator disposed on a first surface of a base plate made of a metal and the base plate and the vibrator element overlap with each other in a plan view.

In the vibrator device (electronic part) described in JP-A-2015-186128, however, the base plate as a heat conducting plate is provided, but one end of the vibrator element is mounted on the heat generator. In this case, since heat from the heat generator directly conducts through the one end of the vibrator element, the heat conducting from the heat generator has a greater effect than the heat radiated from the base mount, undesirably resulting in non-uniformity of the temperature distribution of the vibrator element or what is called unevenness of the temperature of the vibrator element.

SUMMARY

An advantage of some aspects of the invention is to solve at least a part of the problems described above, and the invention can be implemented as the following forms or application examples.

Application Example 1

An oscillator according to this application example includes a container, a first heater disposed in a first area of the container, a second heater disposed in a second area of the container that is different from the first area, a vibrator disposed between the first area and the second area when viewed in a direction perpendicular to a surface on which the first heater is disposed, and a layer that is disposed between the vibrator and the container, overlapping with the first heater, the second heater, and the vibrator when viewed in the direction perpendicular to the surface, and thermal conductivity of the layer is higher than thermal conductivity of the first and second areas.

In the oscillator according to this application example, the vibrator is disposed between the first area, where the first heater is disposed, and the second area, where the second heater is disposed, when viewed in the direction perpendicular to the surface on which the first heater is disposed, and the layer having thermal conductivity higher than the thermal conductivity of the first and second areas is so disposed between the vibrator and the container as to overlap with at least part of the first heater, the second heater, and the vibrator. The arrangement of the thus configured layer allows reduction in non-uniformity of the temperature distribution of the vibrator between the positions facing the first heater and the second heater and the positions facing the portion between the first heater and the second heater. Further, even when the temperatures of the first heater and the second heater differ from each other, the thus disposed layer can reduce the temperature difference, whereby the influence of the temperature non-uniformity can be reduced. As a result, the non-uniformity of the temperature distributions of the vibrator (temperature unevenness) can be reduced, whereby an oscillator having a stabilized resonance frequency can be provided.

Application Example 2

In the oscillator described in the application example, it is preferable that the container is provided with a recess, and that the first heater is so disposed in the recess as to overlap with at least part of the vibrator when viewed in the direction perpendicular to the surface.

According to this application example, since the first heater is so disposed in the recess that at least part thereof overlaps with at least part of the vibrator when viewed in the direction perpendicular to the surface on which the first heater is disposed, the heat radiated by the first heater can more efficiently heat the vibrator. The recess in which the first heater is disposed corresponds to the first area.

Application Example 3

In the oscillator described in the application example, it is preferable that the container is provided with a recess, and that the second heater is so disposed in the recess as to overlap with at least part of the vibrator when viewed in the direction perpendicular to the surface.

According to this application example, since the second heater is so disposed in the recess that at least part thereof overlaps with at least part of the vibrator when viewed in the direction perpendicular to the surface on which the first heater is disposed, the heat radiated by the second heater can more efficiently heat the vibrator. The recess in which the second heater is disposed corresponds to the second area.

Application Example 4

In the oscillator described in the application example, it is preferable that the layer is disposed between the first heater and the container and between the second heater and the container.

According to this application example, the layer disposed between the first heater and the container and between the second heater and the container can be efficiently and reliably heated, whereby non-uniformity of the temperature distribution of the layer can be reduced.

Application Example 5

In the oscillator described in the application example, it is preferable that the layer is disposed between the first heater and the vibrator and between the second heater and the vibrator.

According to this application example, the layer disposed between the first heater and the vibrator and between the second heater and the vibrator is allowed to face the vibrator, whereby variation in temperature of the radiation (radiated heat) toward the vibrator can be reduced, and non-uniformity of the temperature distribution of the vibrator can therefore be reduced.

Application Example 6

It is preferable that the oscillator described in the application example further includes a second container that accommodates the container and a third heater disposed in the second container and connected to the container.

According to this application example, since the third heater disposed in the second container, which contains the container, is connected to the container, which contains the vibrator, non-uniformity of the temperature distribution of the vibrator can be further reduced.

Application Example 7

In the oscillator described in the application example, it is preferable that the container includes a first lid having thermal conductivity higher than thermal conductivity of the first and second areas, and that the third heater is connected to the first lid.

According to this application example, since the third heater is disposed on the first lid having thermal conductivity higher than the thermal conductivity of the first and second areas and connected to the container via the first lid, the non-uniformity of the temperature distribution of the vibrator can be further reduced.

Application Example 8

It is preferable that the oscillator described in the application example further includes a second layer having thermal conductivity higher than thermal conductivity of at least part of the second container, and that the third heater is connected to the container via the second layer.

According to this application example, the second layer having thermal conductivity higher than the thermal conductivity of at least part of the second container, which contains the container, and the third heater, which is connected to the container via the second layer, can further reduce the non-uniformity of the temperature distribution of the vibrator.

Application Example 9

An electronic apparatus according to this application example includes an oscillator including a container, a first heater disposed in a first area of the container, a second heater disposed in a second area of the container that is different from the first area, a vibrator disposed between the first area and the second area when viewed in a direction perpendicular to a surface on which the first heater is disposed, and a layer that is disposed between the vibrator and the container, overlapping with the first heater, the second heater, and the vibrator when viewed in the direction perpendicular to the surface, and thermal conductivity of the layer is higher than thermal conductivity of the first and second areas.

In the electronic apparatus according to this application example, the vibrator is disposed between the first area, where the first heater is disposed, and the second area, where the second heater is disposed, when viewed in the direction perpendicular to the surface on which the first heater is disposed, and the layer having thermal conductivity higher than the thermal conductivity of the first and second areas is so disposed between the vibrator and the container as to overlap with at least part of the first heater, the second heater, and the vibrator. The arrangement of the thus configured layer allows reduction in non-uniformity of the temperature distribution of the vibrator between the positions facing the first heater and the second heater and the positions facing the portion between the first heater and the second heater. Since the electronic apparatus includes the oscillator that can handle a situation in which the temperatures of the first heater and the second heater differ from each other in such a way that the layer disposed described above can reduce the temperature difference and the influence of the temperature non-uniformity can therefore be reduced, the electronic apparatus provided by the present application example is unlikely to be affected by the environment temperature and excels in the temperature characteristic.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
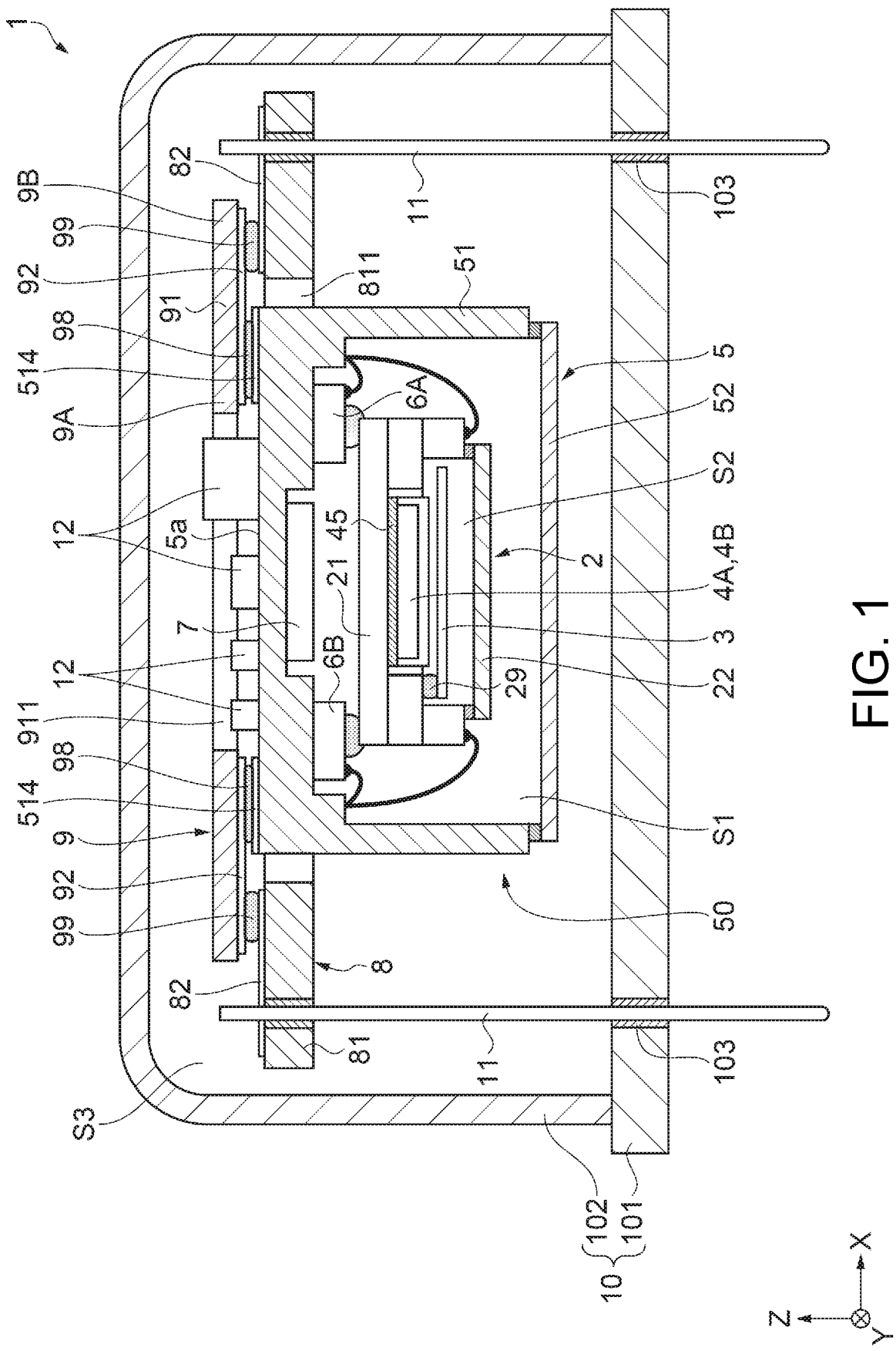
FIG. 1 is a cross-sectional view of an oscillator that is an electronic part according to a first embodiment of the invention.

Oscillators and electronic apparatus according to embodiments of the invention will be described below in detail with reference to the accompanying drawings. It is not intended that the embodiments described below unduly limit the contents of the invention set forth in the appended claims. Further, all configurations described in the embodiments are not necessarily essential configuration requirements of the invention. In the drawings referred to in the following description, three axes perpendicular to one another are set as X, Y and Z axes for ease of description. The Z axis extends in the thickness direction of an oscillator, in other words, the direction in which a second base, which forms a second package as a second container, and a second lid, which is bonded to the second base, are arranged, and the Z axis coincides with the direction perpendicular to a surface on which two heat generators disposed in the second package are disposed. The X axis extends along the direction in which the two heat generators disposed in the second package are arranged, and the Y axis extends along the direction in which two heat generators disposed in a first package are arranged. Further, the direction parallel to the X axis is called an "X-axis direction," the direction parallel to the Y axis is called a "Y-axis direction," and the direction parallel to the Z axis is called an "Z-axis direction" in some cases.

First Embodiment

Figure 2:
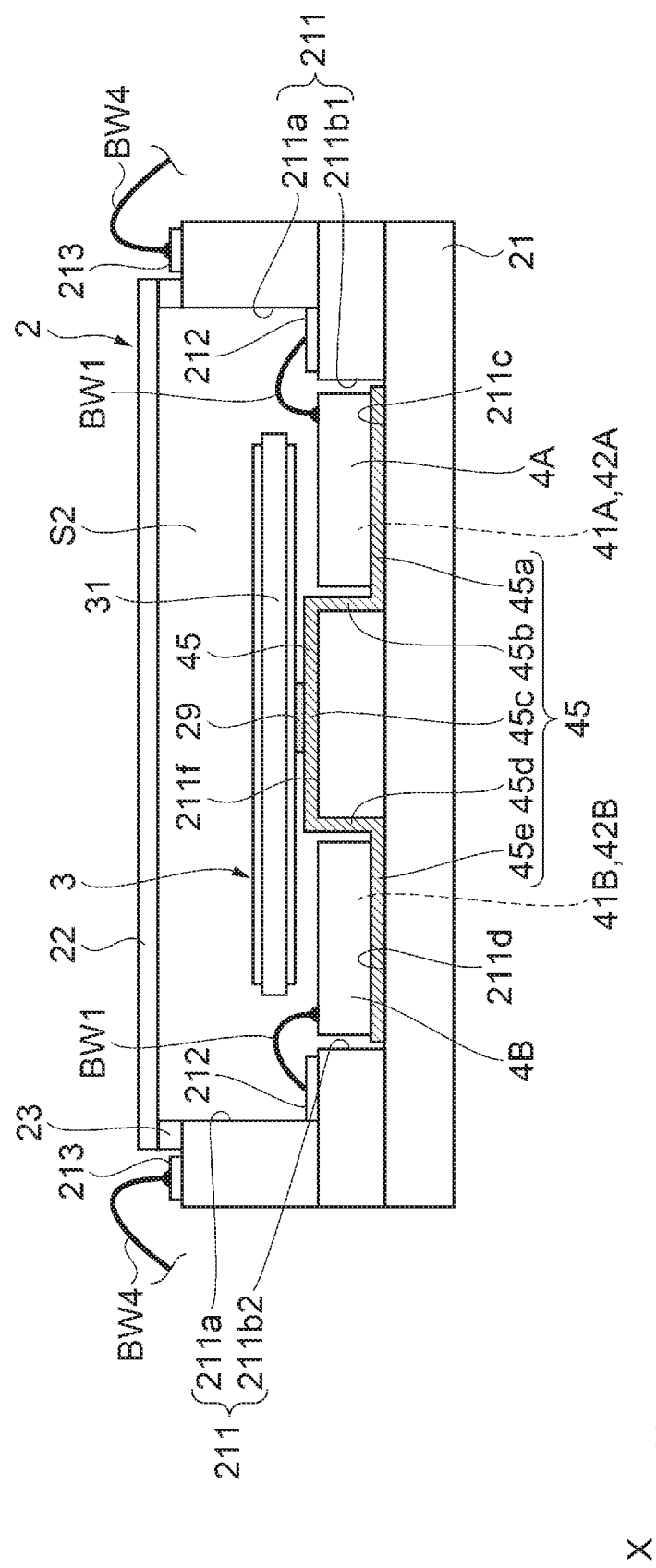
FIG. 2 is a cross-sectional view of a first package of the oscillator according to the first embodiment.
Figure 3:
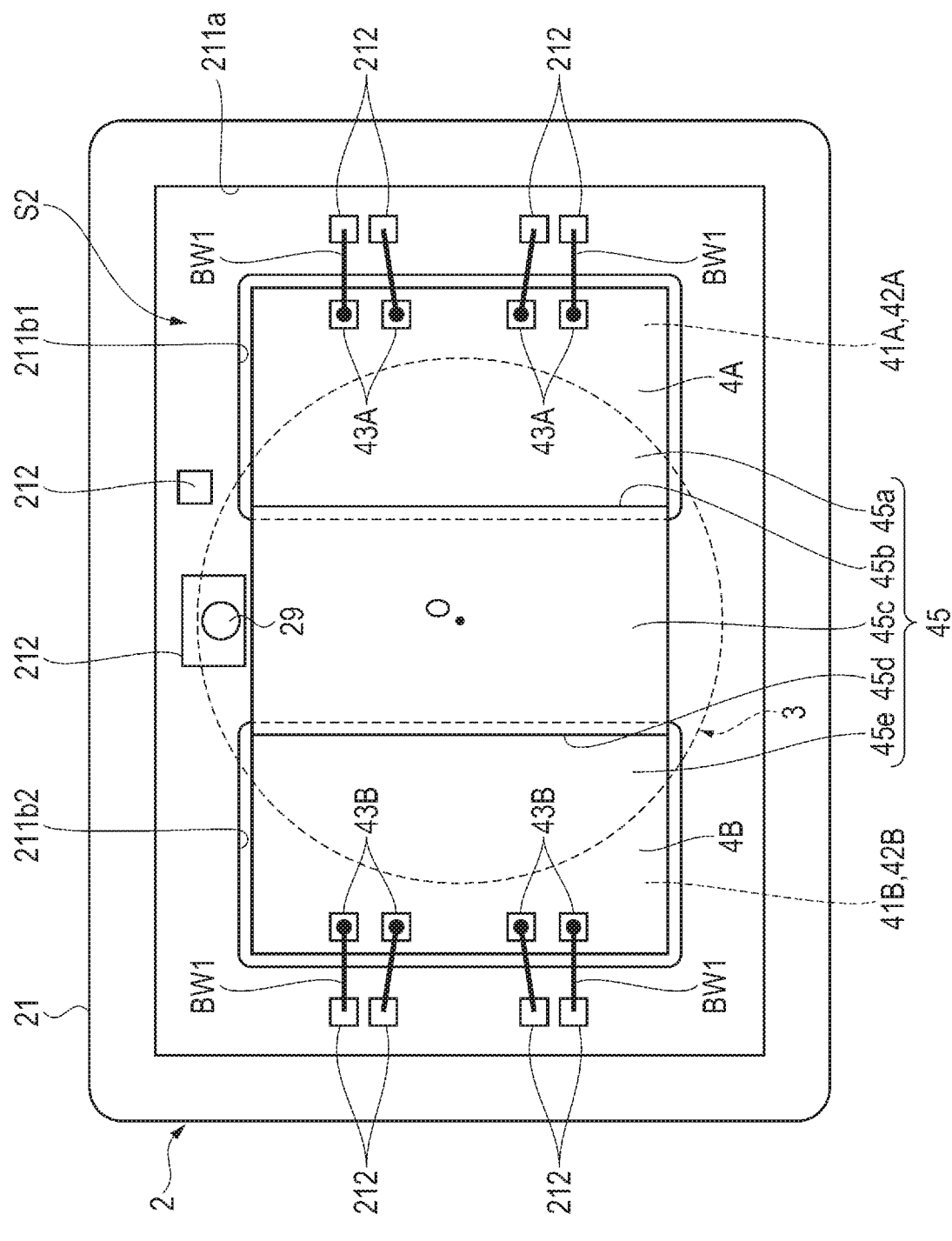
FIG. 3 is a plan view of the first package shown in FIG. 2.
Figure 4:
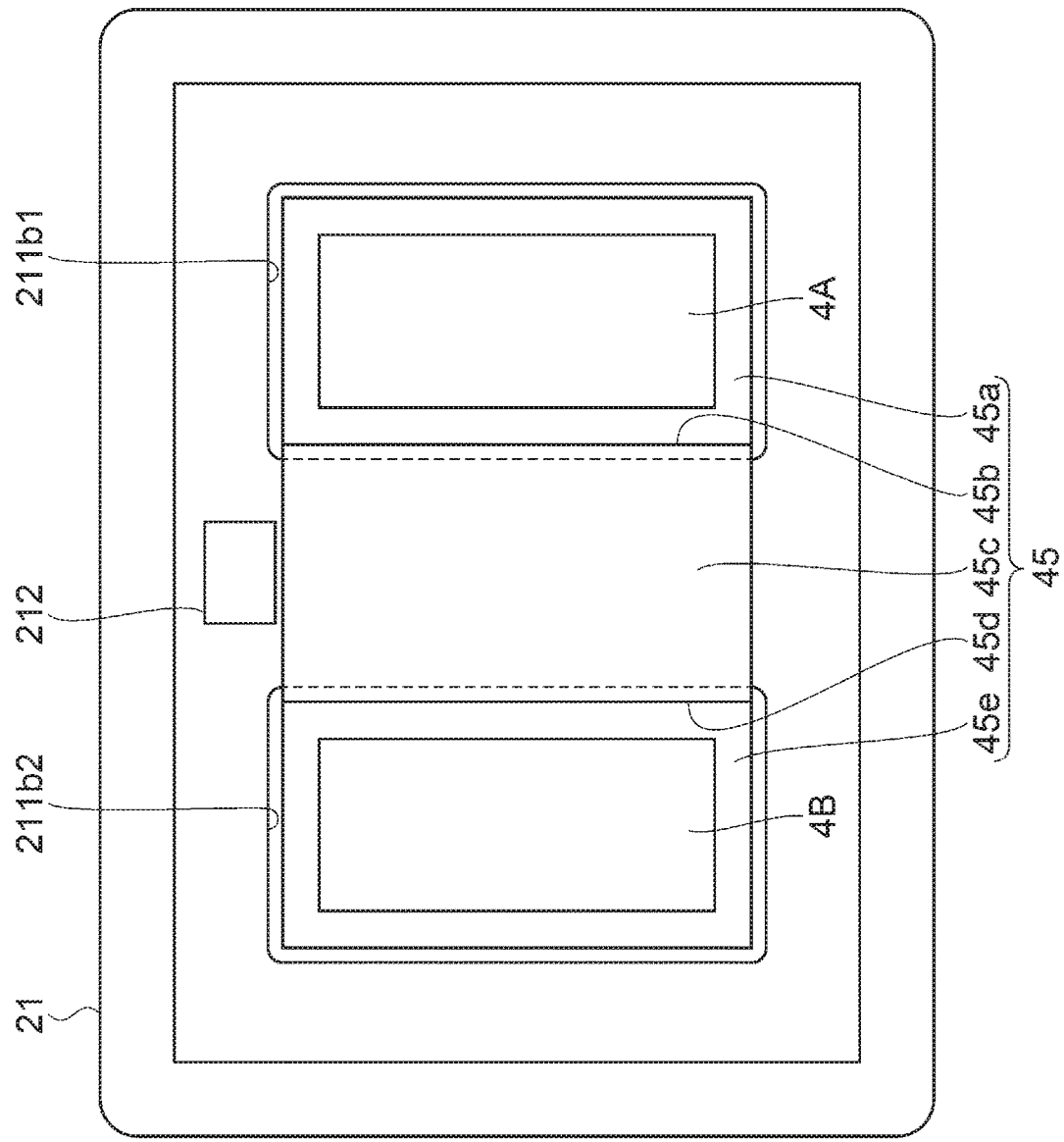
FIG. 4 is a plan view of the first package and shows the arrangement of a heat conducting section.
Figure 5A:
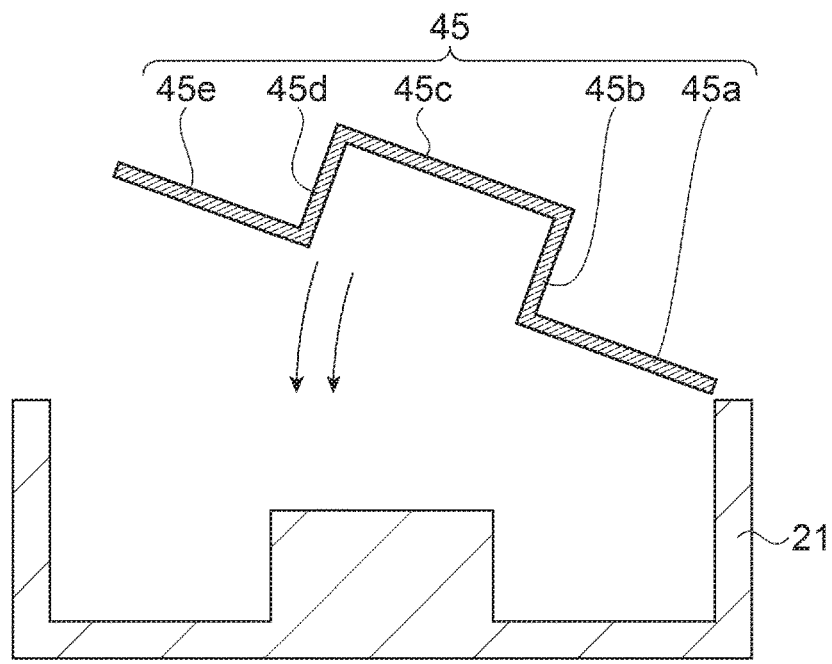
FIG. 5A is a cross-sectional view showing an example of formation of the heat conducting section.
Figure 5B:
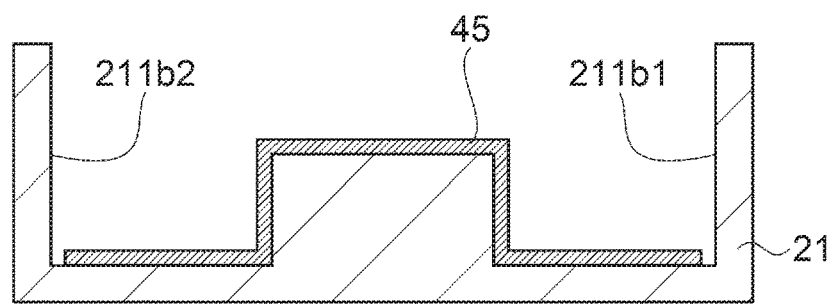
FIG. 5B is a cross-sectional view showing an example of formation of the heat conducting section.
Figure 6:
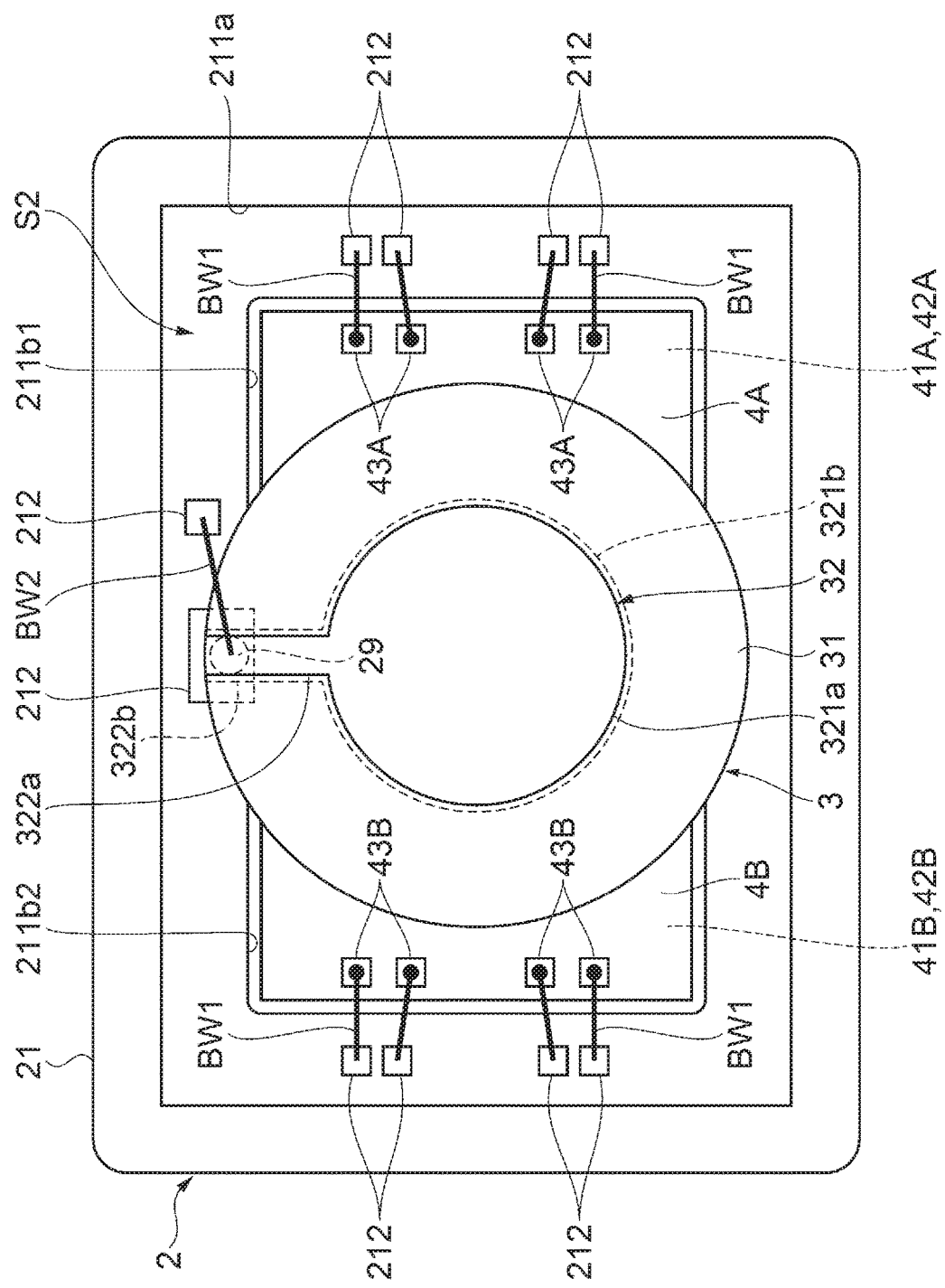
FIG. 6 is a plan view of the first package and shows the arrangement of a vibrator.
Figure 7:
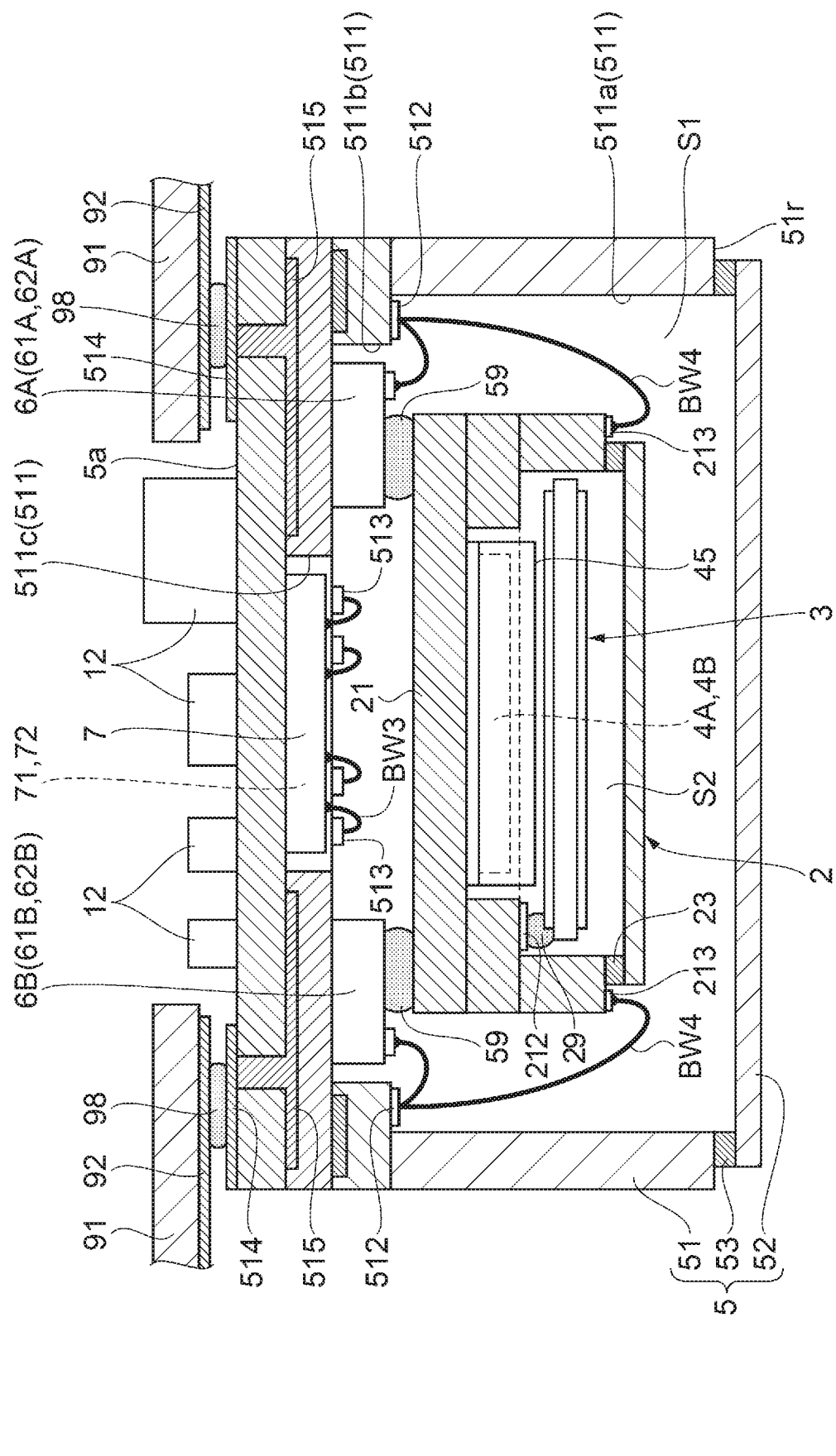
FIG. 7 is a cross-sectional view of a second package of the oscillator according to the first embodiment.
Figure 8:
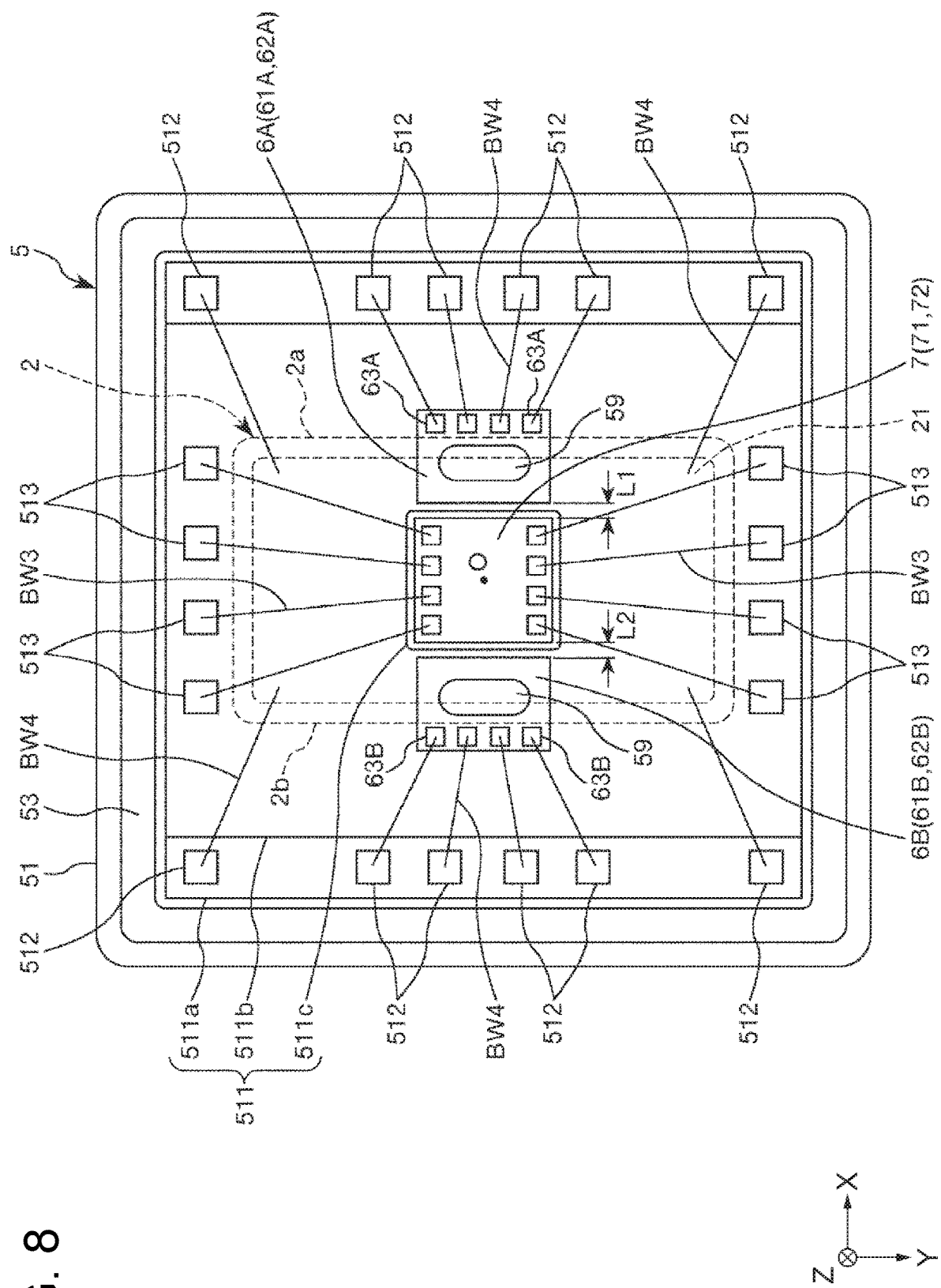
FIG. 8 is a plan view of the second package shown in FIG. 7.
Figure 9:
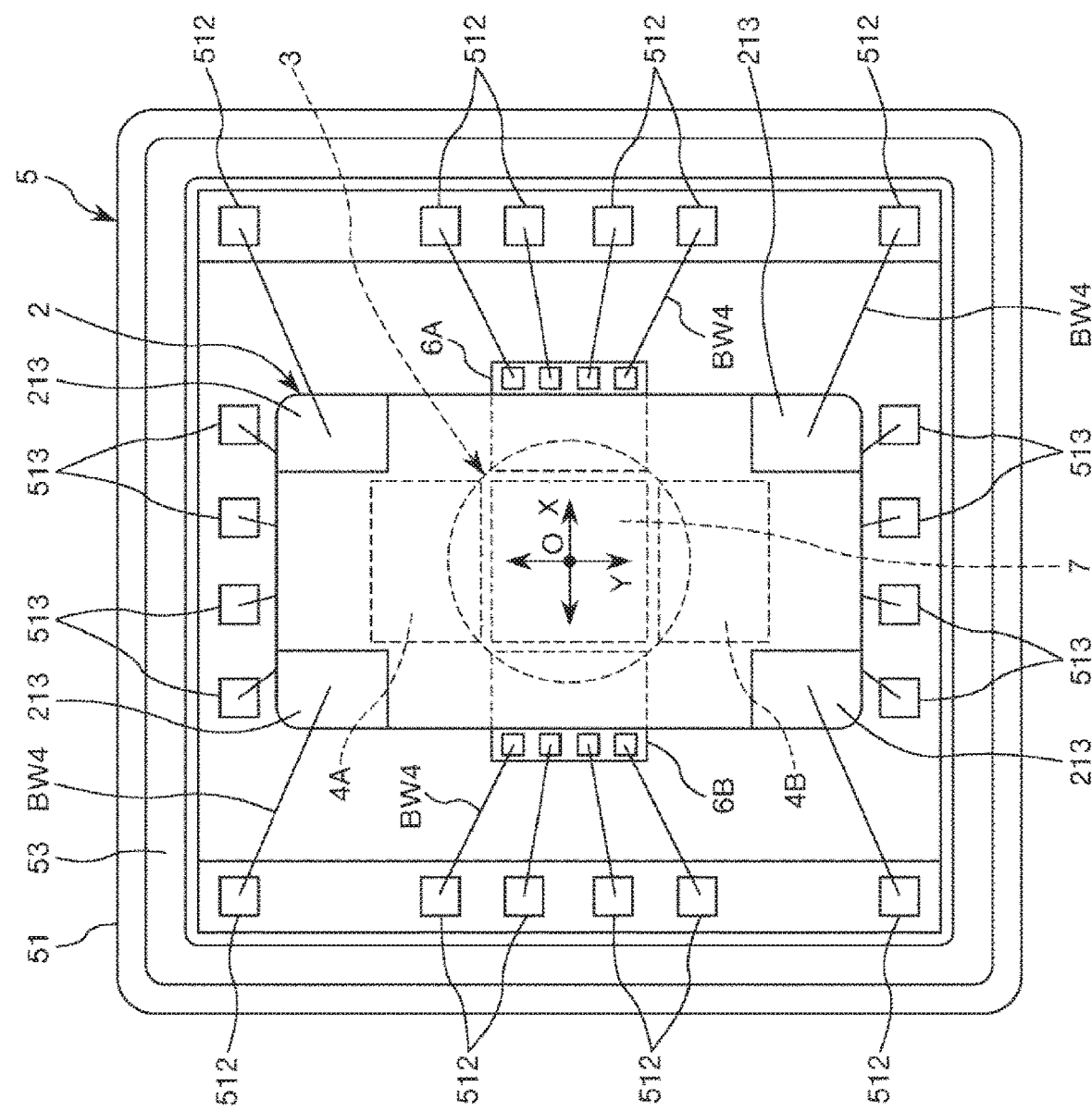
FIG. 9 is a plan view of the second package shown in FIG. 7.

An oscillator that is an electronic part according to a first embodiment of the invention will first be described with reference to FIGS. 1 to 9. FIG. 1 is a cross-sectional view of the oscillator, which is the electronic part according to the first embodiment of the invention. FIG. 2 is a cross-sectional view of a first package of the oscillator according to the first embodiment. FIG. 3 is a plan view of the first package shown in FIG. 2. FIG. 4 is a plan view of the first package and shows the arrangement of a heat conducting section. FIGS. 5A and 5B are cross-sectional views showing an example of formation of the heat conducting section. FIG. 6 is a plan view of the first package and shows the arrangement of a vibrator. FIG. 7 is a cross-sectional view of a second package of the oscillator according to the first embodiment. FIG. 8 is a plan view of the second package shown in FIG. 7. FIG. 9 is a plan view of the second package shown in FIG. 7.

An oscillator 1 according to the first embodiment is an oven controlled crystal oscillator (OCXO). The oscillator 1 includes a second package 5, which includes a second base 51 and a second lid 52 bonded to the second base 51 and serves as a second container, a third heater 6A and a fourth heater 6B, which are accommodated in the second package 5, are mounted on the second base 51, and serve as heat generators, and a circuit element 7, which is accommodated in the second package 5, is mounted on the second base 51, and contains at least part of an oscillation circuit, as shown in FIG. 1. The circuit element 7 is disposed between the third heater 6A and the fourth heater 6B in a plan view of the second package 5 (plan view viewed in Z-axis direction, which is thickness direction of second package 5). The configuration in which the circuit element 7 is disposed between the third heater 6A and the fourth heater 6B allows the third heater 6A and the fourth heater 6B to efficiently heat the circuit element 7. Deviation of the temperature of the circuit element 7 from a predetermined value can therefore be reduced, whereby the oscillator 1 is unlikely to be affected by variation in outside temperature and therefore provides high reliability.

The oscillator 1 further includes the second package 5 as the second container, the third heater 6A, the fourth heater 6B, and the circuit element 7 accommodated in the second package 5, a first package 2 as a container accommodated in the second package 5, a vibrator 3 as an oscillator element accommodated in the first package 2, a first heater 4A and a second heater 4B as heat generators, circuit parts 12, which are disposed on an upper surface 5a of the second package 5, which is the surface opposite the side where the second lid 52 is connected to the second base 51, a wiring substrate 8, a flexible substrate 9, which supports the second package 5 and is connected to the wiring substrate 8, a third package 10, which accommodates the wiring substrate 8, the flexible substrate 9, and the second package 5, and a plurality of pins 11, which are electrically connected to the wiring substrate 8, fix the wiring substrate 8 to the third package 10, and pass through the third package 10.

First Package

The first package 2 as the container includes a first base 21, on which the vibrator 3, the first heater 4A, and the second heater 4B are mounted, a first lid 22, which is so bonded to the first base 21 that a second accommodation space S2, which accommodates the vibrator 3, the first heater 4A, and the second heater 4B, is provided between the first lid 22 and the first base 21, and a frame-shaped seal ring 23, which is located between the first base 21 and the first lid 22 and bonds the first base 21 and the first lid 22 to each other, as shown in FIG. 2.

The first base 21 has a cavity 211, which opens in the −Z-axis direction, and has a roughly oblong shape in the plan view along the Z-axis direction, as shown in FIG. 3. It is assumed in the following description that the direction along the Z axis from the bottom surface of the first base 21 toward the opening thereof is the −Z-axis direction, and that the direction along the Z axis from the opening of the first base 21 toward the bottom surface thereof is a +Z-axis direction. The cavity 211 has a first section 211a, which opens through the −Z-axis-direction-side of the first base 21, and a second section including two recesses 211b1 and 211b2, which open through the bottom surface of the first section 211a. The recess 211b1 (one of the recesses) and the recess 211b2 (the other recess) are arranged side by side in the longitudinal direction of the first base 21 and disposed on opposite sides with respect to the center O of the first package 2 in the plan view of the first package 2. In other words, the recesses 211b1 and 211b2 are disposed on opposite sides with respect to an imaginary line passing through the center O of the first package and perpendicular to the longitudinal direction of the first base 21 in the plan view. In the present embodiment, the recess 211b1 corresponds to a first area, the recess 211b2 corresponds to a second area, and the direction perpendicular to the bottom surfaces of the recesses 211b1 and 211b2 coincides with the Z-axis direction.

When viewed in the Z-axis direction, the recess 211b1, in which the first heater 4A is disposed, is so disposed that at least part of the vibrator 3, which is disposed in the second accommodation space S2, overlaps with at least part of the first heater 4A, and the recess 211b2, in which the second heater 4B is disposed, is so disposed that at least part of the vibrator 3 overlaps with at least part of the second heater 4B. The arrangement of the recesses 211b1 and 211b2 described above allows the heat radiated by the first heater 4A and the second heater 4B to more efficiently heat the vibrator 3.

On the other hand, the first lid 22 has a plate-like shape and is so bonded to the −Z-axis-side end surface of the first base 21 via the seal ring 23 as to close the opening of the cavity 211. The seal ring 23 has a frame-like shape and is located between the −Z-axis-side end surface of the first base 21 and the first lid 22. The thus configured seal ring 23 is made of a metal material, and the first base 21 and the first lid 22 are hermetically bonded to each other when the seal ring 23 melts. The arrangement described above in which the first lid 22 closes the opening of the cavity 211 allows formation of the second accommodation space S2, and the second accommodation space S2 can accommodate the vibrator 3, the first heater 4A, and the second heater 4B.

The second accommodation space S2 of the hermetically sealed first package 2 has reduced pressure (lower than or equal to about 10 Pa, for example). The vibrator 3 can therefore be continuously driven in a stable manner. The second accommodation space S2 functions as a heat insulating layer, whereby the oscillator 1 is unlikely to be affected by variation in outside temperature. The second accommodation space S2 does not necessarily have a specific atmosphere and may be filled, for example, with nitrogen, argon, or any other inert gas and have the atmospheric pressure.

The first base 21 is not necessarily made of a specific material and can be made, for example, of an aluminum oxide or any of a variety of other ceramic materials. In this case, a laminate of ceramic sheets (green sheets) can be burned to produce the first base 21. The first lid 21 is not necessarily made of a specific material and is preferably formed of a member having a coefficient of linear expansion close to that of the material of which the first base 21 is made. For example, in the case where the material of which the first base 21 is made is the ceramic material described above, the material of which the first lid 22 is made is preferably a metal material (Kovar or any other alloy, for example).

The first base 21 has a plurality of inner terminals 212 disposed on a bottom surface 211$f$ of the first section 211$a$. Some of the inner terminals 212 are electrically connected to the first heater 4A or the second heater 4B via bonding wires BW1, as shown in FIG. 3, and one of the inner terminals 212 is electrically connected to the vibrator 3 via a bonding wire BW2 (see FIG. 6). The inner terminals 212 are further electrically connected to outer terminals 213 via internal wiring lines (not shown) disposed in the first base 21. The outer terminals 213 are disposed on a surface of the first base 21 or the surface facing the first lid 22 and in a portion that is not covered with the first lid 22.

First heater and the second heater

The first heater 4A and the second heater 4B, which serve as heat generators, are disposed on opposite sides with respect to the center O of the first package 2 in the plan view of the first package 2, as shown in FIGS. 2, 3, and 4. The thus disposed first heater 4A and second heater 4B are each an electronic part having what is called a "thermostat function" of heating the vibrator 3 and the circuit element 7 to keep the temperatures thereof at roughly fixed values. Keeping the temperatures of the vibrator 3 and the circuit element 7 roughly constant allows suppression of variation in the frequency of the oscillator 1 due to variation in outside temperature (temperature in environment where oscillator is used), whereby the oscillator 1 has excellent frequency stability. In the oscillator 1, the temperature of the vibrator 3 is preferably controlled to approach the top temperature showing the zero temperature coefficient (top temperature varies in accordance with specifications and ranges, for example, from about 70 to 100° C.). Excellent frequency stability is thus achieved.

Specifically, the first heater 4A and the second heater 4B are disposed in the two recesses 211$b$1 and 211$b$2, which are provided in the first base 21, which forms the first package 2. The first heater 4A is disposed in the recess 211$b$1 as the first area, and the second heater 4B is disposed in the recess 211$b$2 as the second area different from the first area.

Heat Conducting Section

A first bottom plate 45$a$ and a second bottom plate 45$e$, which are part of a heat conducting section 45, which serves as a first layer having a heat conducting function, are disposed between a bottom surface 211$c$ of the recess 211$b$1 and the first heater 4A and between a bottom surface 211$d$ of the recess 211$b$2 and the second heater 4B, respectively. In other words, the heat conducting section 45 as the first layer is at least disposed between the first heater 4A and the first base 21, which forms the first package 2 as the container, and between the second heater 4B and the first base 21. The first heater 4A is fixed to the first bottom plate section 45$a$ via an adhesive or any other component, and the second heater 4B is fixed to the second bottom plate section 45$e$ via an adhesive or any other component. The configuration in which the heat conducting section 45 is disposed between the first heater 4A and the first base 21 and between the second heater 4B and the first base 21 allows efficient, reliable heating of the heat conducting section 45, whereby non-uniformity of the temperature distribution of the entire heat conducting section 45 can be reduced.

The heat conducting section 45 as the first layer includes the first bottom plate section 45$a$, which extends along the bottom surface 211$c$ of the recess 211$b$1, a first wall section 45$b$, which is bent with respect to the first bottom plate section 45$a$ in the Z-axis direction along a wall surface of the recess 211$b$1, which is one of the recesses, the wall surface facing the recess 211$b$2, the second bottom plate section 45$e$, which extends along the bottom surface 211$d$ of the recess 211$b$2, a second wall section 45$d$, which is bent with respect to the second bottom plate section 45$e$ in the Z-axis direction along a wall surface of the recess 211$b$2 or the wall surface facing the recess 211$b$1, and a top plate section 45$c$, which connects the first wall section 45$b$ and the second wall section 45$d$ to each other and extends along the bottom surface 211$f$ of the first section 211$a$, as shown in FIG. 2.

It is preferable that the first bottom plate section 45$a$, the first wall section 45$b$, the top plate section 45$c$, the second wall section 45$d$, the second bottom plate section 45$e$ are integrated with one another and made of a material having thermal conductivity higher than that of the first and second areas, for example, copper, a copper alloy, aluminum, or any other metal. In the present embodiment, the thermal conductivity of the heat conducting section 45 is higher than the thermal conductivity of the first base 21 having the first and second areas. That is, the heat conducting section 45 can be formed as an integrated structure by pressing and bending a flat thin plate made of any of the metals described above, for example, in a press work into a predetermined shape, as shown in FIG. 5A, and the thus formed heat conducting section 45 can be mounted on the first base 21 and disposed in a predetermined position, as shown in FIG. 5B. The heat conducting section 45 is not necessarily formed and disposed by the method described above and can instead be formed, for example, by using a plating method.

Since the thus configured heat conducting section 45 as the first layer is disposed, the heat from the first heater 4A and the second heater 4B is conducted through the first bottom plate section 45$a$ and the second bottom plate section 45$e$ to the top plate section 45$c$ between the first heater 4A and the second heater 4B. As a result, non-uniformity of the temperature distribution of the vibrator 3 between the positions facing the first heater 4A and the second heater 4B and the positions facing the portion between the first heater 4A and the second heater 4B can be reduced. Further, even when the temperatures of the first heater 4A and the second heater 4B differ from each other, the heat conducting section 45 allows heat conduction, which can reduce the temperature difference.

The first heater 4A and the second heater 4B include heat generation circuits 41A and 41B, which each include, for example, a power transistor, and temperature detection circuit 42A and 42B, which are each formed of a diode or a thermistor, and the temperatures for which the heat generation circuits 41A and 41B are responsible are controlled based on the outputs from the temperature detection circuit 42A and 42B, whereby the temperatures of the vibrator 3 and the circuit element 7 can be maintained at fixed values. The heat generation circuit 41A or 41B or the temperature detection circuit 42A or 42B is not necessarily configured in a specific manner. For example, the temperature detection circuit 42A and 42B may be circuits separate from the first heater 4A and the second heater 4B.

A plurality of terminals 43A and 43B are provided on the upper surfaces of the first heater 4A and the second heater 4B, respectively, and the plurality of terminals 43A and 43B are electrically connected to the corresponding inner terminals 212 via the bonding wires BW1.

Vibrator

The vibrator 3 is disposed in the second accommodation space S2 and fixed to the inner terminal 212 that is disposed on the bottom surface of the first section 211a of the first base 21 via an electrically conductive fixing member 29, as shown in FIG. 6. The thus configured vibrator 3 includes a quartz crystal substrate 31 and an electrode 32 disposed on the quartz crystal substrate 31.

The quartz crystal substrate 31 is an SC-cut quartz crystal substrate machined or otherwise processed into a roughly circular shape in the plan view. Using an SC-cut quartz crystal substrate prevents the vibrator 3 from experiencing a frequency jump due to spurious vibration, reduces an increase in the resistance of the vibrator 3, and stabilizes the temperature characteristic of the vibrator 3. The quartz crystal substrate 31 does not necessarily have a circular shape in the plan view and may instead have an elliptical shape, an oblong shape, or any other shape formed of a non-straight line or a triangular shape, a rectangular shape, or any other shape formed of straight lines. It is, however, noted that the circular quartz crystal substrate 31 in the present embodiment can improve the symmetry of the quartz crystal substrate 31 and hence effectively suppress oscillation due to secondary vibration (spurious vibration).

The electrode 32 includes a first excitation electrode 321a and a first extracted electrode 321b, which are disposed on one surface (principal surface) of the quartz crystal substrate 31, and a second excitation electrode 322a and a second extracted electrode 322b, which are disposed on the other surface (principal surface) of the quartz crystal substrate 31 that is the surface opposite the one surface thereof.

An outer edge portion of the thus configured vibrator 3 is fixed to one of the inner terminals 212 via the electrically conductive fixing member 29. The fixing member 29 bonds the vibrator 3 to the first base 21, electrically connects the inner terminal 212 to the second extracted electrode 322, and further thermally connects the vibrator 3 to the first base 21. On the other hand, the first extracted electrode 321b is electrically connected to another inner terminal 212 via the bonding wire BW2.

The fixing member 29 is not necessarily made of a specific material and may be made of any material that is both electrically conductive and bondable, for example, a metal bonding material (silver past, copper paste, for example), an alloy bonding material (gold-tin alloy, solder or any other bump, for example), or an electrically conductive adhesive (polyimide-based adhesive in which silver fillers or any other metal fine particles are dispersed).

The vibrator 3 is disposed between the first heater 4A and the second heater 4B in the plan view of the first package 2, as shown in FIG. 6. Specifically, the center of the vibrator 3 is located between the first heater 4A and the second heater 4B in the plan view of the first package 2. Further, the fixing member 29 is disposed in a position separate from the first heater 4A and the second heater 4B by roughly the same distance. The heat from the first heater 4A and the second heater 4B can therefore be equally conducted to the vibrator 3, whereby the vibrator 3 can be efficiently heated with no unevenness.

Further, at least part of the vibrator 3 is so disposed as to overlap with the first heater 4A and the second heater 4B. The distances from the vibrator 3 to the first heater 4A and the second heater 4B can therefore be reduced, whereby the heat radiated from the first heater 4A and the second heater 4B can efficiently heat the vibrator 3.

Second Package

The second package 5 as the second container includes the second base 51, to which the third heater 6A, the fourth heater 6B, and the circuit element 7 are fixed, the second lid 52, which is so bonded to an end surface 51r of the second base 51 that the third heater 6A, the fourth heater 6B, the circuit element 7, and the first package 2 are accommodated between the second lid 52 and the second base 51, and a seal ring 53, which is located between the second base 51 and the second lid 52 and bonds the second base 51 and the second lid 52 to each other, as shown in FIG. 7.

The second base 51 has a cavity 511, which opens in the −Z-axis direction in FIG. 7 and has a roughly square shape in the plan view, as shown in FIG. 8. The cavity 511 has a first recess 511a, which opens through the −Z-axis-direction-side of the second base 51 in FIG. 7, a second recess 511b, which opens through the bottom surface of the first recess 511a, and a third recess 511c, which opens through the bottom surface of the second recess 511b. On the other hand, the second lid 52 has a plate-like shape and is so bonded to the end surface 51r of the second base 51 via the seal ring 53 as to close the opening of the cavity 511. The seal ring 53 has a frame-like shape and is located between the end surface 51r of the second base 51 and the second lid 52. The thus configured seal ring 53 is made of a metal material, and the second base 51 and the second lid 52 are hermetically bonded to each other when the seal ring 53 melts. The configuration in which the second lid 52 closes the opening of the cavity 51 allows formation of a first accommodation space S1, and the first accommodation space S1 accommodates the third heater 6A, the fourth heater 6B, the circuit element 7, and the first package 2.

The second package 5 is hermetically sealed, and the first accommodation space S1 has reduced pressure (lower than or equal to about 10 Pa, for example, but first accommodation space S1 is preferably vacuum space). The first accommodation space S1 is therefore allowed to function as a heat insulating layer, whereby the oscillator 1 is unlikely to be affected by variation in outside temperature. The first accommodation space S1 does not necessarily have a specific atmosphere.

The second base 51 is not necessarily made of a specific material and can be made, for example, of an aluminum oxide or any of a variety of other ceramic materials. In this case, a laminate of ceramic sheets (green sheets) can be burned to produce the second base 51. The second lid 51 is not necessarily made of a specific material and is preferably formed of a member having a coefficient of linear expansion close to that of the material of which the second base 51 is made. For example, in the case where the material of which the second base 51 is made is the ceramic material described above, the material of which the second lid 52 is made is preferably a metal material (Kovar or any other alloy, for example).

The second base 51 has a plurality of inner terminals 512 disposed on the bottom surface of the first recess 511a, a plurality of inner terminals 513 disposed on the bottom surface of the second recess 511b, and a plurality of outer terminals 514 disposed on the bottom surface of the second base 51 (upper surface 5a of second package 5). The inner terminals 512 are electrically connected to the outer terminals 213 of the first package 2 or the third heater 6A and the fourth heater 6B via bonding wires BW4. The inner terminals 513 are electrically connected to the circuit element 7 via bonding wires BW3. The inner terminals 512 and 513 are electrically connected to each other via internal wiring lines 515 disposed in the second base 51 and electrically connected to the outer terminals 514.

Third Heater and the Fourth Heater

The oscillator 1 includes the third heater 6A and the fourth heater 6B fixed to the bottom surface of the second recess 511b via an adhesive or any other component, as shown in FIG. 7. The third heater 6A and the fourth heater 6B are each an electronic part having what is called a "thermostat function" of heating both the circuit element 7 and the vibrator 3 to keep the temperatures thereof at roughly fixed values.

The oscillator 1 includes the first heater 4A, the second heater 4B, the third heater 6A, and the fourth heater 6B as elements that heat the circuit element 7 and the vibrator 3 as described above and can therefore more intensely heat the circuit element 7 and the vibrator 3. Therefore, even in a case where the outside temperature sharply changes, the temperatures of the circuit element 7 and the vibrator 3 can be more reliably maintained at fixed values. (In other words, variation in the temperatures of the circuit element 7 and the vibrator 3 can be reduced.) Since the circuit element 7 and the vibrator 3 each have a temperature characteristic (characteristic of each of circuit element 7 and the vibrator 3 changes with temperature), maintaining the temperatures of the circuit element 7 and the vibrator 3 allow effective suppression of variation in the frequency of the oscillator 1, whereby the oscillator 1 has excellent frequency stability and provides high reliability.

The third heater 6A and the fourth heater 6B are so disposed as to sandwich the circuit element 7 in the plan view of the second package 5, as shown in FIG. 8. The third heater 6A and the fourth heater 6B can therefore heat the circuit element 7 from opposite sides thereof with no unevenness, whereby the temperature of the circuit element 7 can be precisely maintained at a fixed value. Now let L1 be the distance by which the circuit element 7 and the third heater 6A are separate from each other in the plan view of the second package 5, and let L2 be the distance by which the circuit element 7 and the fourth heater 6B are separate from each other in the plan view of the second package 5, and $0.9 \leq L1/L2 \leq 1.1$ is preferably satisfied, or $0.95 \leq L1/L2 \leq 1.05$ is more preferably satisfied. When either of the expressions is satisfied, the third heater 6A and the fourth heater 6B can roughly equally conduct their heat to the circuit element 7 and can therefore efficiently heat the circuit element 7 with no unevenness.

The thus configured third heater 6A and the fourth heater 6B include heat generation circuits 61A and 61B, which each include, for example, a power transistor, and temperature detection circuit 62A and 62B, which are each formed of a diode or a thermistor, and the temperatures for which the heat generation circuits 61A and 61B are responsible are controlled based on the outputs from the temperature detection circuit 62A and 62B, whereby the temperatures of the circuit element 7 and the vibrator 3 can be maintained at fixed values, as in the case of the first heater 4A and the second heater 4B. The heat generation circuit 61A or 61B or the temperature detection circuit 62A or 62B is not necessarily configured in a specific manner.

A plurality of terminals 63A and 63B are provided on surfaces of the third heater 6A and the fourth heater 6B or the −Z-axis-direction-side surfaces in FIG. 8 and electrically connected to the inner terminals 512 via the bonding wires BW4, as shown in FIG. 8.

The first package 2 is fixed to the third heater 6A and the fourth heater 6B. Specifically, the first package 2 is mounted on surfaces of the third heater 6A and the fourth heater 6B or the −Z-axis-direction-side surfaces in FIG. 8 via fixing members 59. Since the first package 2 is fixed to the third heater 6A and the fourth heater 6B, the heat produced by the third heater 6A and the fourth heater 6B can be efficiently transferred to the vibrator 3 via the first package 2. Therefore, the temperature of the vibrator 3 can be readily maintained at a fixed value, and the power consumption can be lowered.

The first package 2 is so disposed that the first package 2 and the second base 51 sandwich the circuit element 7, and at least part of the circuit element 7 is located between the first package 2 and the second base 51. The second base 51 and the first package 2 heated by the third heater 6A and the fourth heater 6B can therefore also heat the circuit element 7. That is, the circuit element 7 can be heated in the four directions (on opposite sides in X-axis direction by third heater 6A and the fourth heater 6B and on opposite sides in Z-axis direction by second base 51 and first package 2). The circuit element 7 can therefore be efficiently heated with no unevenness. In particular, in the present embodiment, in which the entire circuit element 7 is located between the first package 2 and the second base 51, the effect described above is more markedly provided.

Further, the first package 2 is so disposed that the first base 21 faces the third heater 6A and the fourth heater 6B and the first base 21 is fixed to the third heater 6A and the fourth heater 6B, as shown in FIG. 7. The first heater 4A and the second heater 4B are connected to the inner side of the first base 21, as described above, and the first base 21 can be efficiently heated by combined heating performed by the first heater 4A, the second heater 4B and the third heater 6A, the fourth heater 6B, whereby the circuit element 7 can be more efficiently heated. Further, since the heat from the first base 21 is stably transferred to the vibrator 3 via the first base 21 and the heat conducting section 45 with no unevenness, the temperature of the vibrator 3 can be more precisely maintained at a fixed value.

The third heater 6A and the fourth heater 6B are disposed on opposite sides with respect to the center O of the first package 2 in the plan view of the first package 2, as shown in FIG. 8. The third heater 6A is so disposed as to overlap with one long edge 2a of the first package 2, and the fourth heater 6B is so disposed as to overlap with the other long edge 2b of the first package 2 in the plan view of the first package 2. Further, the vibrator 3 and the circuit element 7 are so disposed that the centers thereof coincide with each other in the plan view of the first package 2, and the distance by which the third heater 6A and the vibrator 3 are separate from each other is roughly equal to the distance by which the fourth heater 6B and the vibrator 3 are separate from each other. The arrangement of the third heater 6A and the fourth heater 6B described above allows the heat from the third heater 6A and the fourth heater 6B to be roughly equally conducted to the vibrator 3 via the first package 2, whereby the third heater 6A and the fourth heater 6B can efficiently heat the vibrator 3 with no unevenness.

The first base 21 of the first package 2 is so disposed as to overlap with at least part of the circuit element 7 in the plan view of the first package 2. In particular, in the present embodiment, the first base 21 is so disposed as to overlap with the entire surface of the circuit element 7. The arrangement described above allows the heat from the first package 2 to efficiently heat the circuit element 7.

The circuit element 7 is disposed between the first heater 4A and the second heater 4B in the plan view of the second package 5, as shown in FIG. 9. Specifically, the center of the circuit element 7 (center of gravity of outer shape of circuit element 7 in plan view) is located between the first heater 4A and the second heater 4B in the plan view of the first package 2. Further, the distance by which the center of the circuit element 7 and the first heater 4A are separate from each other is roughly equal to the distance by which the center of the circuit element 7 and the second heater 4B are separate from each other. The heat from the first heater 4A and the second heater 4B is therefore roughly equally conducted to the circuit element 7, whereby the first heater 4A and the second heater 4B can more efficiently heat the circuit element 7 with no unevenness.

The third heater 6A and the fourth heater 6B are so disposed not to overlap with the first heater 4A and the second heater 4B in the plan view of the second package 5, as shown in FIG. 9. For example, if at least part of the third heater 6A and the fourth heater 6B overlaps with the first heater 4A and the second heater 4B, the first package 2 could undesirably be excessively heated in the overlapping portion, and excessive temperature unevenness (temperature gradient) could therefore occur in the first package 2. The temperature unevenness is not preferable because it prevents the vibrator 3 or the circuit element 7 from being stably heated. From this reason, the configuration in which the first heater 4A or the second heater 4B does not overlap with the third heater 6A or the fourth heater 6B, as in the present embodiment, allows the vibrator 3 and the circuit element 7 to be stably heated. It is, however, noted that the first heater 4A, the second heater 4B and the third heater 6A, the fourth heater 6B may be so disposed that at least part of the former two heaters overlap with at least part of the latter two heaters. The heat conducting section can reduce temperature unevenness that occurs in the overlapping arrangement described above.

In the plan view of the second package 5, the third heater 6A and the fourth heater 6B are disposed side by side along the X-axis direction, and the first heater 4A and the second heater 4B are disposed side by side along the Y-axis direction. The circuit element 7 and the vibrator 3 can therefore be heated in the four directions by the four heat generators (first heater 4A, second heater 4B, third heater 6A, and fourth heater 6B) in the plan view of the second package 5. The circuit element 7 and the vibrator 3 can therefore be efficiently heated with no unevenness. In particular, in the present embodiment, since the X-axis direction and the Z-axis direction are perpendicular to each other, and the four heat generators (first heater 4A, second heater 4B, third heater 6A, and fourth heater 6B) are symmetrically disposed with respect to the center of the circuit element 7 (that is, the distances by which the center of the circuit element 7 and the four heaters are separate from each other are equal to one another in the plan view), the effect described above is more markedly provided.

Circuit Element

The circuit element 7 is fixed to the bottom surface of the third recess 511c via an adhesive or any other component, as shown in FIGS. 7 and 8. Further, the circuit element 7 is located roughly at the center of the second package 5 in the plan view of the second package 5. Moreover, the circuit element 7 is electrically connected to the inner terminals 513 via the bonding wires BW3. The thus configured circuit element 7 includes, for example, an oscillation circuit 71, which causes the vibrator 3 to oscillate, and a temperature control circuit 72, which controls the action of the heat generation circuits 41A and 41B based on the outputs from the temperature detection circuit 42A and 42B and controls the action of the heat generation circuits 61A and 61B based on the outputs from the temperature detection circuit 62A and 62B. The temperature control circuit 72 can control the drive operation of the first heater 4A, the second heater 4B, the third heater 6A, and the fourth heater 6B independently of one another.

Circuit Parts

The circuit parts 12 are disposed in plurality on the upper surface 5a of the second package 5 (bottom surface of second base 51). The plurality of circuit parts 12 are circuit constituent parts that form, along with the circuit element 7, the oscillation circuit 71 and the temperature control circuit 72. The configuration in which the circuit parts 12 are disposed in positions outside the second package 5 allows reduction in the size of the second package 5, whereby the first heater 4A, the second heater 4B, the third heater 6A, and the fourth heater 6B can more efficiently heat the circuit element 7 and the vibrator 3.

The circuit parts 12 are not limited to specific parts and may, for example, be a resistive element, a capacitor element, and an inductor element. Some of the circuit parts 12 have temperature characteristics. The configuration in which the circuit parts 12 are disposed on the upper surface 5a of the second package 5, that is, the configuration in which the circuit parts 12 face the third heater 6A and the fourth heater 6B via the second base 51 therefore allows the third heater 6A and the fourth heater 6B to heat the circuit parts 12, whereby the circuit parts 12 can be maintained at temperatures roughly equal to the temperature of the circuit element 7. Therefore, variation in the frequency of the oscillator 1 can be effectively suppressed, whereby the oscillator 1 has excellent frequency stability.

Wiring Substrate

The wiring substrate 8 can be a known rigid printed circuit board and includes, for example, a hard base section 81 and wiring lines 82 disposed on the base section 81, as shown in FIG. 1. An opening 811 is provided in the base section 81, and the second package 5 is disposed in the opening 811.

Flexible Substrate

The flexible substrate 9 supports the second package 5 and is connected to the wiring substrate 8, as shown in FIG. 1. The flexible substrate 9 and the second package 5 are fixed to each other via an electrically conductive fixing member 98, and the flexible substrate 9 and the wiring substrate 8 are fixed to each other via an electrically conductive fixing member 99. The thus configured flexible substrate 9 can be formed of a known flexible printed circuit board and includes a flexible sheet-shaped (film-shaped) base section 91 and wiring lines 92 disposed on the base section 91.

The base section 91 has a sheet-like shape and has a package mounting area 9A, which is set in a central portion of the base section 91, and a wiring substrate connecting area 9B, which is set in the periphery of the base section 91. The second package 5 is mounted on the package mounting area 9A and connected to the wiring substrate 8 in the wiring substrate connectable area 9B. The wiring lines 92 in the package mounting area 9A are electrically connected to the outer terminals 514 of the second package 5 via the fixing member 98, and the wiring lines 92 in the wiring substrate connecting area 9B are electrically connected to the wiring lines 82 via the fixing member 99. The thus configured flexible substrate 9 has flexibility and is therefore deformable in accordance with thermal expansion of the second package 5 and the wiring substrate 8. Stress is therefore unlikely to be induced in the portions where the flexible substrate 9 is bonded to the second package 5 and the wiring substrate 8, resulting in improvement in the reliability of the mechanical and electrical connection between the second package 5 and the flexible substrate 9 and between the wiring substrate 8 and the flexible substrate 9. In particular, in the case where the temperatures of the circuit element 7 and the vibrator 3 are controlled by the first heater 4A, the second heater 4B, the third heater 6A, and the fourth heater 6B, the temperatures of the circuit element 7 and the vibrator 3 greatly differ between the state in which the oscillator 1 is powered on and the state in which the oscillator 1 is powered off, and a larger amount of deformation due to thermal expansion occurs in the oscillator 1 than in an oscillator that does not include the first heater 4A, the second heater 4B, the third heater 6A, or the fourth heater 6B. However, even in this case, the oscillator 1 can operate in a reliable manner. Further, in a case where impact acts on the oscillator 1, the flexible substrate 9 can absorb and reduce the impact, whereby the possibility of damage of the circuit element 7 and the vibrator 3 can be further reduced.

Further, an opening 911 is formed in the package mounting area 9A of the base section 91, and the circuit parts 12 are disposed in the opening 911. Providing the opening 911 prevents the circuit parts 12 mounted on the upper surface 5a of the second package 5 from interfering with the base section 91. The shape of the opening 911 may be a closed shape that does not open through the side surface of the base section 91 or an open shape that opens through the side surface of the flexible substrate 9.

Third Package, Pins

The third package 10 accommodates a structure 50 formed of the second package 5, the flexible substrate 9, and the wiring substrate 8, as shown in FIG. 1. The thus configured third package 10 can protect the structure 50.

The third package 10 includes a plate-shaped third base 101 and a cap-shaped third lid 102 bonded to the third base 101, and a third accommodation space S3 formed by the third base 101 and the third lid 102 accommodates the structure 50. The third package 10 is hermetically sealed, and the third accommodation space S3 has educed pressure (lower than or equal to about 10 Pa, for example, but third accommodation space S3 is preferably vacuum space). The third accommodation space S3 is therefore allowed to function as a heat insulating layer, whereby the oscillator 1 is unlikely to be affected by variation in outside temperature. The third accommodation space S3 is not limited to the atmosphere described above and may be filled, for example, with nitrogen, argon, or any other inert gas and have the atmospheric pressure.

The third base 101 and the third lid 102 can each be made, for example, of a metal material or a resin material.

A plurality of through holes are formed in the third base 101, and electrically conductive pins 11 are inserted into the through holes. The pins 11 are each formed, for example, of a hermetic terminal, and the gaps between the through holes and the pins 11 are hermetically sealed with a sealing material 103. The sealing material 103 further fixes the pins 11 to the third base 101. One-side end portions of the pins 11 are fixed to the wiring substrate 8 and fix the structure 50 to the third package 10 with the structure 50 freely separating from the third package 10. Outside heat is therefore unlikely to be conducted to the structure 50, whereby the oscillator is unlikely to be affected by variation in outside temperature.

The pins 11 are electrically connected to the wiring lines 82 provided on the wiring substrate 8. Since the other-side end portions of the pins 11 that are opposite the one-side end portions thereof are exposed to the space outside the oscillator 1, the oscillator 1 can be readily mechanically and electrically connected to a mother board or any other external apparatus via the other-side end portions.

In the oscillator 1 according to the first embodiment described above, since the first heater 4A, the second heater 4B, and the heat conducting section 45 are disposed in the first base 21, which forms the first package 2, the heat conducting section 45 can be efficiently and reliably heated, whereby non-uniformity of the temperature distribution of the entire heat conducting section 45 can be reduced. In addition, since the first package 2 is connected to the third heater 6A and the fourth heater 6B fixed to the second base 51, which forms the second package 5, what is called a "thermostat function" of keeping the temperatures of the circuit element 7 and the vibrator 3 roughly constant can be further enhanced. As a result, non-uniformity of the temperature distributions of the vibrator 3 and the circuit element 7 (temperature unevenness) can be reduced, whereby an oscillator 1 having a stabilized resonance frequency can be provided.

Second Embodiment

Figure 10:
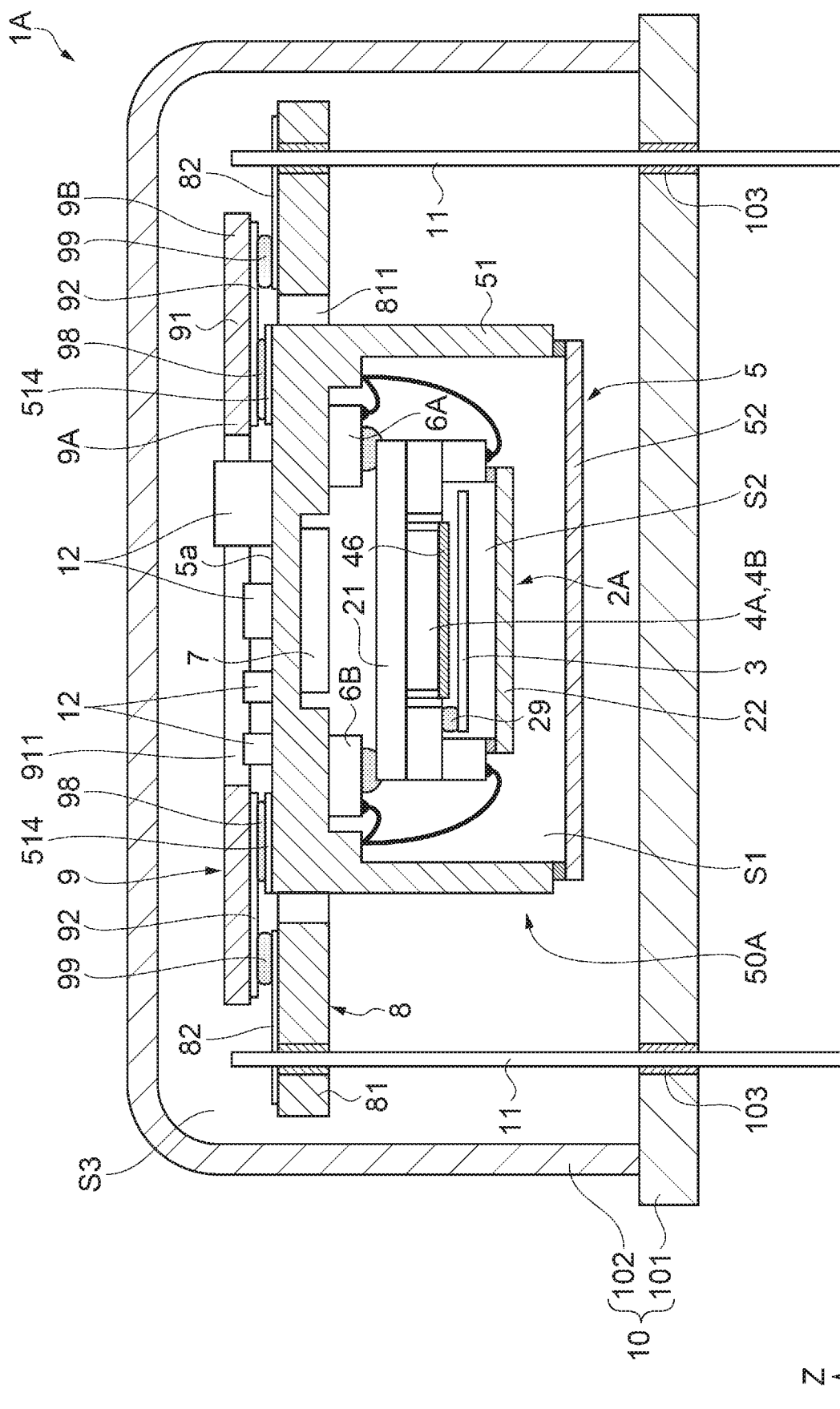
FIG. 10 is a cross-sectional view of an oscillator that is an electronic part according to a second embodiment of the invention.
Figure 11:
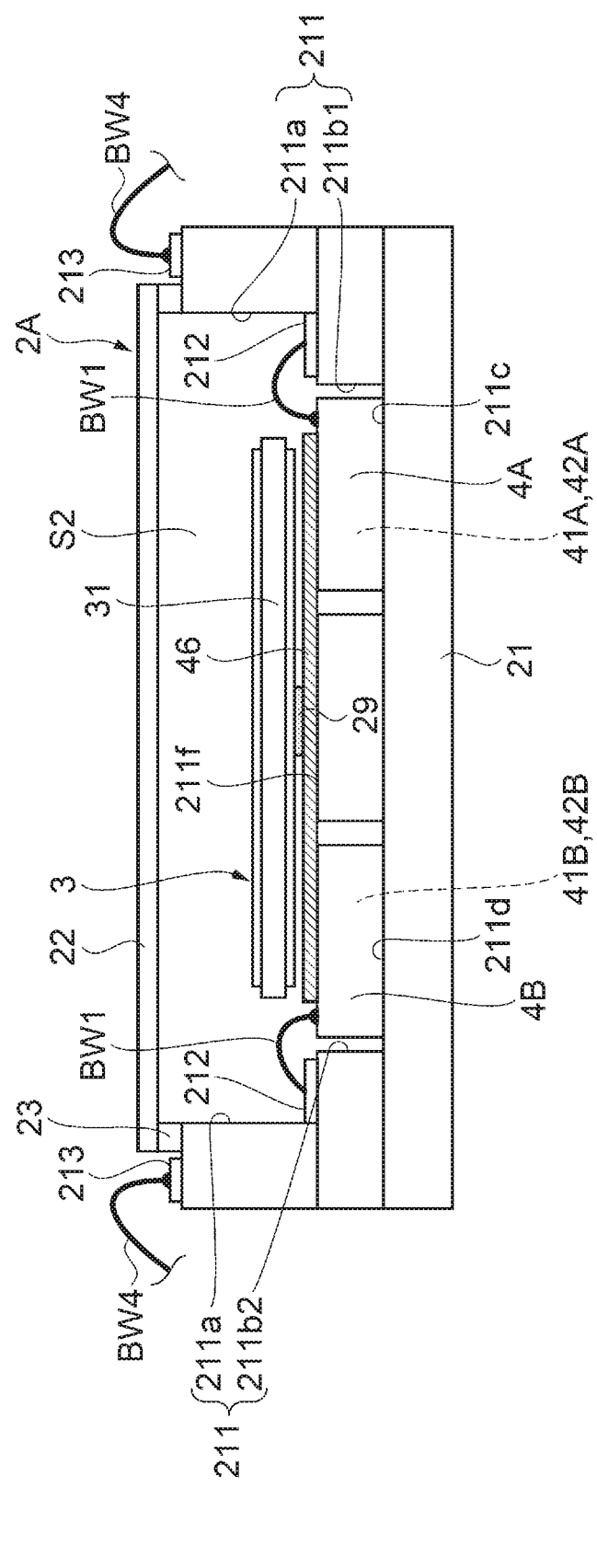
FIG. 11 is a cross-sectional view of a first package of the oscillator according to the second embodiment.
Figure 12:
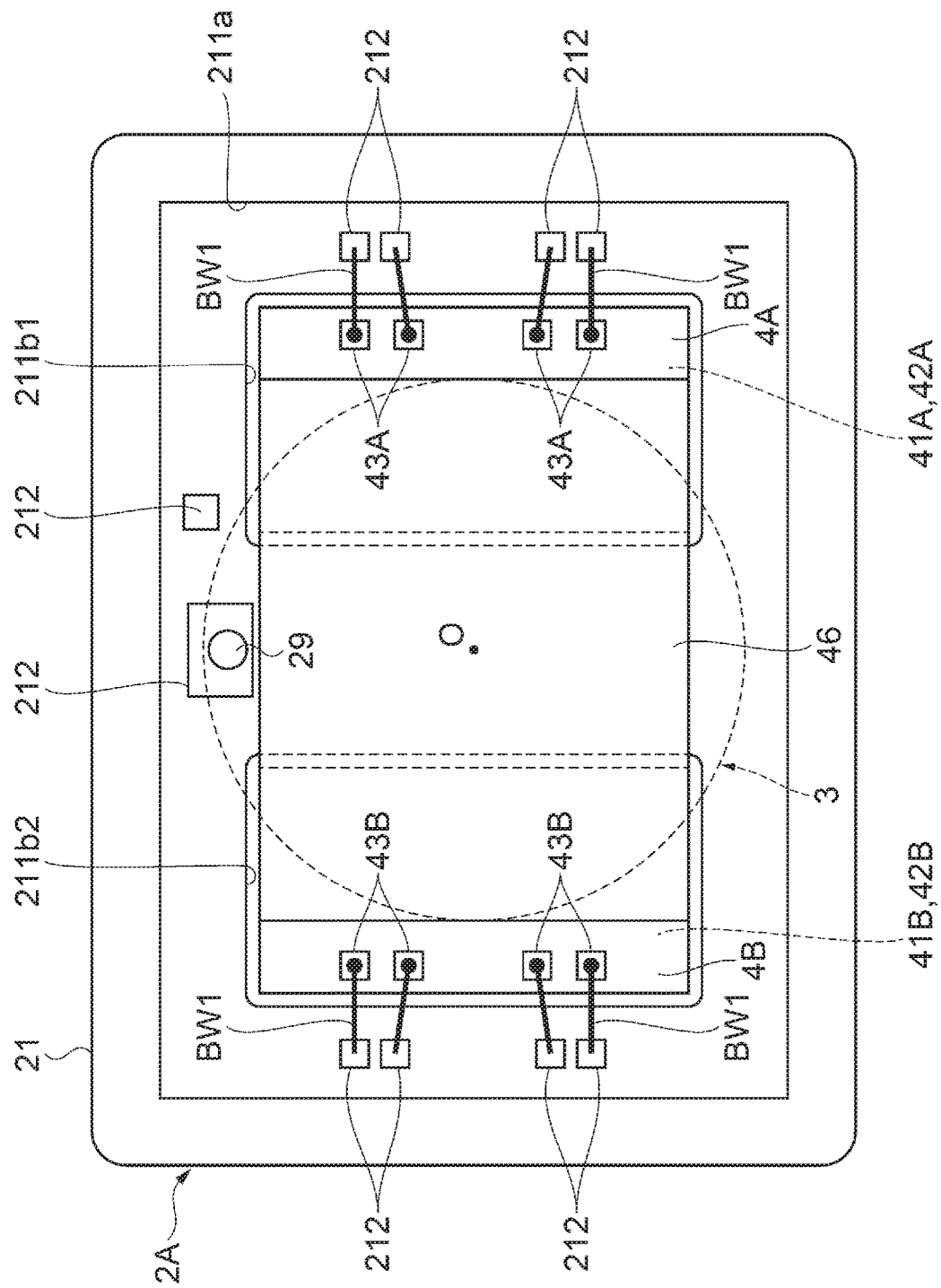
FIG. 12 is a plan view of the first package shown in FIG. 11.

An oscillator that is an electronic part according to a second embodiment of the invention will next be described in detail with reference to FIGS. 10, 11, and 12. FIG. 10 is a cross-sectional view of the oscillator that is the electronic part according to the second embodiment of the invention. FIG. 11 is a cross-sectional view of a first package of the oscillator according to the second embodiment. FIG. 12 is a plan view of the first package shown in FIG. 11. The second embodiment will be described primarily on a configuration different from the configuration in the first embodiment described above, and the same configurations have the same reference character in the figures and will not be described in some cases.

An oscillator 1A according to the second embodiment shown in FIGS. 10, 11, and 12 is the same as the oscillator according to the first embodiment described above primarily except that a heat conducting section 46, which is disposed in a first package 2A and serves as the first layer, is configured differently. The configuration of the heat conducting section 46 as the first layer, which is the different configuration, will be primarily described below.

The oscillator 1A according to the present embodiment includes the first package 2A, the second package 5, and the third package 10, as shown in FIG. 10. The third accommodation space S3 in the third package 10 accommodates a structure 50A including the first package 2A and the second package 5. The second package 5 and the third package 10 are the same as those in the first embodiment as described above and will therefore not be described.

First Package

The first package 2A includes the first base 21, on which the vibrator 3, the first heater 4A, and the second heater 4B are mounted, the first lid 22, which is so bonded to the first base 21 that the second accommodation space S2, which accommodates the vibrator 3, the first heater 4A, and the second heater 4B, is provided between the first lid 22 and the first base 21, and the frame-shaped seal ring 23, which is located between the first base 21 and the first lid 22 and bonds the first base 21 and the first lid 22 to each other, as shown in FIGS. 11 and 12.

The first base 21 has the cavity 211, which opens in the −Z-axis direction, has the same configuration as that in the first embodiment, and is provided with the recess 211b1, in which the first heater 4A is disposed, and the recess 211b2, in which the second heater 4B is disposed.

On the other hand, the first lid 22 has a plate-like shape and is so bonded to the −Z-axis-side end surface of the first base 21 via the seal ring 23 as to close the opening of the cavity 211. The first base 21 and the first lid 22 are hermetically bonded to each other when the seal ring 23 melts. The configuration in which the first lid 22 closes the opening of the cavity 211 allows formation of the second accommodation space S2, and the second accommodation space S2 can accommodate the vibrator 3, the first heater 4A, and the second heater 4B. The second accommodation space S2 of the hermetically sealed first package 2A has reduced pressure (lower than or equal to about 10 Pa, for example, but second accommodation space S2 is preferably vacuum space), as in the first embodiment.

First Heater and Second Heater

The first heater 4A and the second heater 4B, which serve as heat generators, are disposed in the recesses 211b1 and 211b2, which are provided in the first base 21, which forms the first package 2A, respectively, as in the first embodiment. Specifically, the first heater 4A is disposed in the recess 211b1 as the first area, and the second heater 4B is disposed in the recess 211b2 as the second area different from the first area. The first heater 4A is fixed to the bottom surface of the recess 211b1 via an adhesive or any other component, and the second heater 4B is fixed to the bottom surface of the recess 211b2 via an adhesive or any other component.

Heat Conducting Section

The heat conducting section 46 as the first layer is disposed between the first heater 4A and the vibrator 3 and between the second heater 4B and the vibrator 3. The heat conducting section 46 is preferably formed of a thin-plate-shaped member having a heat conducting function and made of a material having thermal conductivity higher than that of the first and second areas, for example, copper, a copper alloy, aluminum, or any other metal. The heat conducting section 46 extends from the positions facing the first heater 4A through the positions between the first heater 4A and the second heater 4B to the positions facing the second heater 4B. Since the heat conducting section 46 is disposed between the first heater 4A and the vibrator 3 and between the second heater 4B and the vibrator 3 as described above, the portion between the first heater 4A and the second heater 4B where no heat generator is provided is also heated by the conducted heat. The entire heat conducting section 46 is therefore heated, whereby non-uniformity of the temperature distribution of the heat conducting section 46, which faces and heats the vibrator 3, can be reduced.

The heat conducting section 46 is allowed to be in contact with one-side surfaces of the first heater 4A and the second heater 4B as long as the heat conducting section 46 does not interfere with the plurality of terminals 43A and 43B, which are provided on the one-side surfaces of the first heater 4A and the second heater 4B, which are −Z-axis-direction-side surfaces, or the bonding wires BW1 from the terminals 43A and 43B. The configuration in which the heat conducting section 46 is in contact with the first heater 4A and the second heater 4B as described above allows the heat conducting section 46 to be more efficiently heated.

The arrangement of the thus configured heat conducting section 46 as the first layer allows the heat from the first heater 4A and the second heater 4B to be conducted to the entire heat conducting section 46. As a result, non-uniformity of the temperature distribution of the vibrator 3 between the positions facing the first heater 4A and the second heater 4B and the positions facing the portion between the first heater 4A and the second heater 4B can therefore be reduced. Further, even when the temperatures of the first heater 4A and the second heater 4B differ from each other, the heat conducting section 46 allows heat conduction, which can reduce the temperature difference. The oscillator 1A according to the second embodiment can thus also provide the same effects as those provided by the oscillator 1 according to the first embodiment described above.

In the second embodiment described above, the flat-plate-shaped heat conducting section 46 is used, the two recesses 211b1 and 211b2 are provided, and the first heater 4A and the second heater 4B are disposed in the recesses, but not necessarily. In another configuration using the flat-plate-shaped heat conducting section 46, no recess 211b1 or 211b2 is provided, the first base 21, which forms the first package 2A, is configured as a flat plate, and the first heater 4A and the second heater 4B are disposed on the flat-plate-shaped first base 21. The flat-plate-shaped heat conducting section 46 is then disposed on the surfaces of the first heater 4A and the second heater 4B, and the heat conducting section 46 is used as a bed that supports the vibrator 3 to connect the vibrator 3 onto the heat conducting section 46. The configuration described above can also provide the same effects as those provided by the second embodiment.

Third Embodiment

Figure 13:
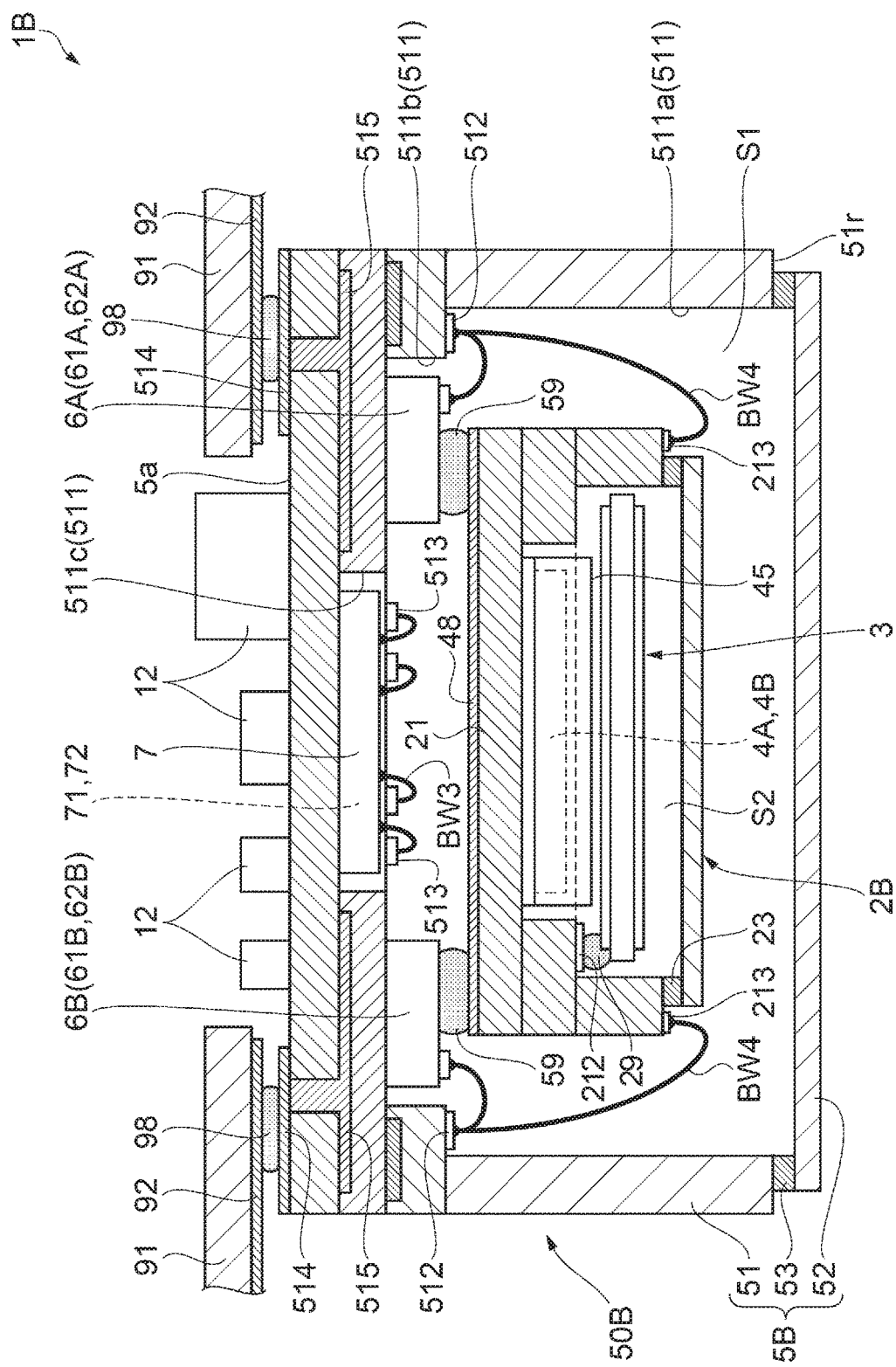
FIG. 13 is a partial cross-sectional view of an oscillator that is an electronic part according to a third embodiment of the invention.

An oscillator that is an electronic part according to a third embodiment of the invention will next be described in detail with reference to FIG. 13. FIG. 13 is a partial cross-sectional view of the oscillator that is the electronic part according to the third embodiment of the invention. FIG. 13 shows a cross section of a structure 50B, which forms an oscillator 1B according to the third embodiment. The third embodiment will be described below primarily on a configuration different from the configuration in the first embodiment described above, and the same configurations have the same reference character in the figure and will not be described in some cases.

The oscillator 1B according to the third embodiment shown in FIG. 13 is the same as the oscillator 1 according to the first embodiment described above primarily except that a heat conducting plate 48 as a second layer is disposed between a first package 2B and the third heater 6A and between the first package 2B and the fourth heater 6B. The configuration of the heat conducting plate 48 as the second layer, which is the different configuration, will be primarily described below.

The structure 50B, which forms the oscillator 1B according to the present embodiment, includes a first package 2B, a second package 5B, and a third package (not shown), as shown in FIG. 13. A third accommodation space (not shown) in the third package accommodates the structure 50B including the first package 2B and the second package 5B. In the present embodiment, the configurations of the first package 2B and the second package 5B are the same as those in the first embodiment and will not be described.

In the structure 50B, at least part of the second package 5B, in the present embodiment, the heat conducting plate 48 as the second layer having thermal conductivity higher than that of the second base 51 is disposed between the first package 2B and the third heater 6A and between the first package 2B and the fourth heater 6B. The heat conducting plate 48 has roughly the same shape as that of the first package 2B in the plan view and is made of a material having thermal conductivity higher than that of the second base 51, for example, copper, a copper alloy, aluminum, or any other metal. The first package 2B is fixed to the third heater 6A and the fourth heater 6B via the fixing member 59, such as an adhesive, with the heat conducting plate 48 sandwiched between the first package 2B and the third heater 6A and between the first package 2B and the fourth heater 6B.

The configuration in which the heat conducting plate 48 as the second layer having thermal conductivity higher than that of the second base 51 of the second package 5B is disposed between the first package 2B and the third heater 6A and between the first package 2B and the fourth heater 6B allows the heat produced by the third heater 6A and the fourth heater 6B to be more readily conducted toward the heat conducting plate 48 than toward the second base 51. The heat produced by the third heater 6A and the fourth heater 6B can therefore be readily conducted to the vibrator 3 via the heat conducting plate 48. Further, the vibrator 3 can be efficiently heated, and non-uniformity of the temperature distribution thereof can be reduced.

Fourth Embodiment

Figure 14:
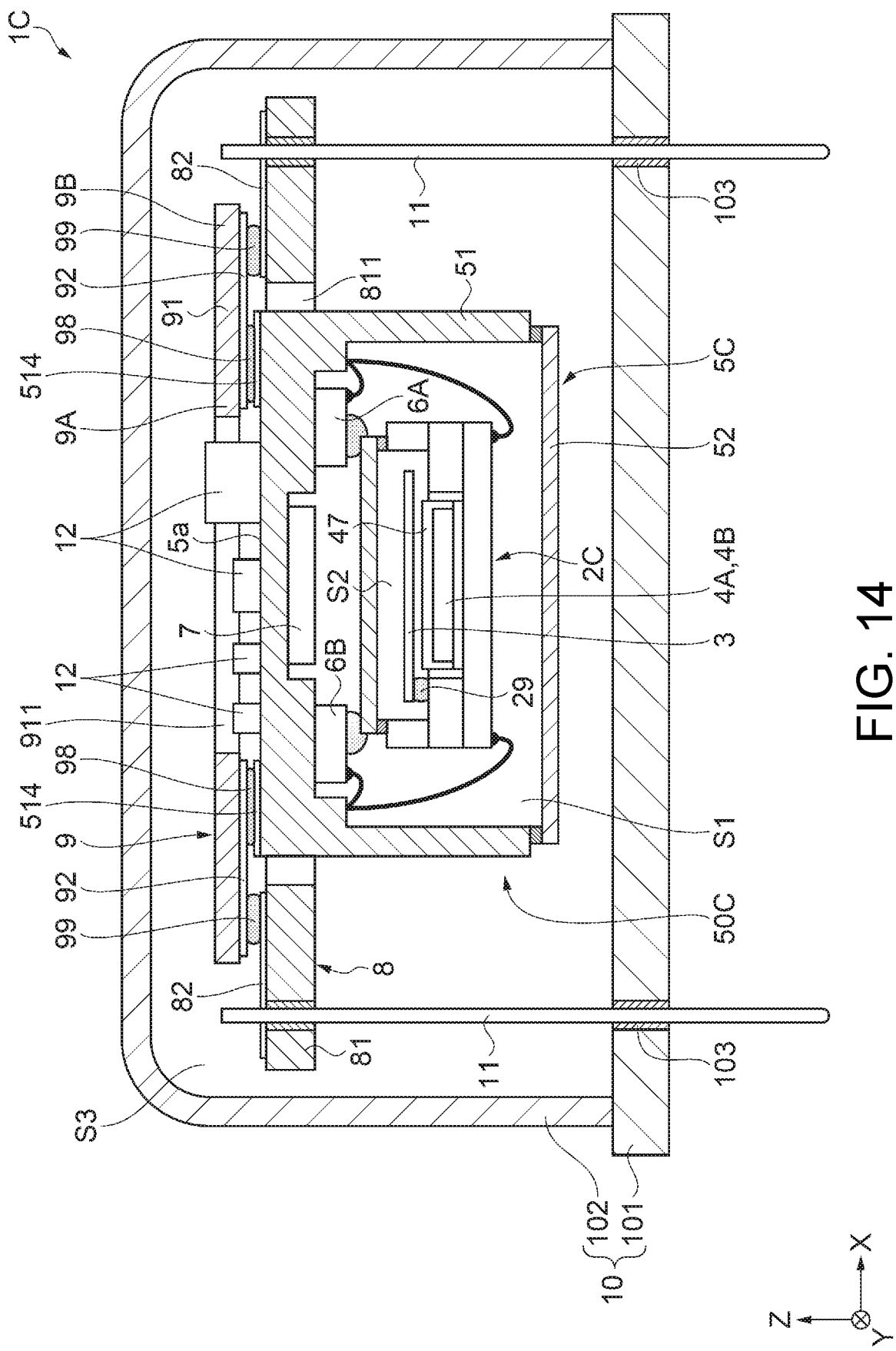
FIG. 14 is a cross-sectional view of an oscillator that is an electronic part according to a fourth embodiment of the invention.
Figure 15:
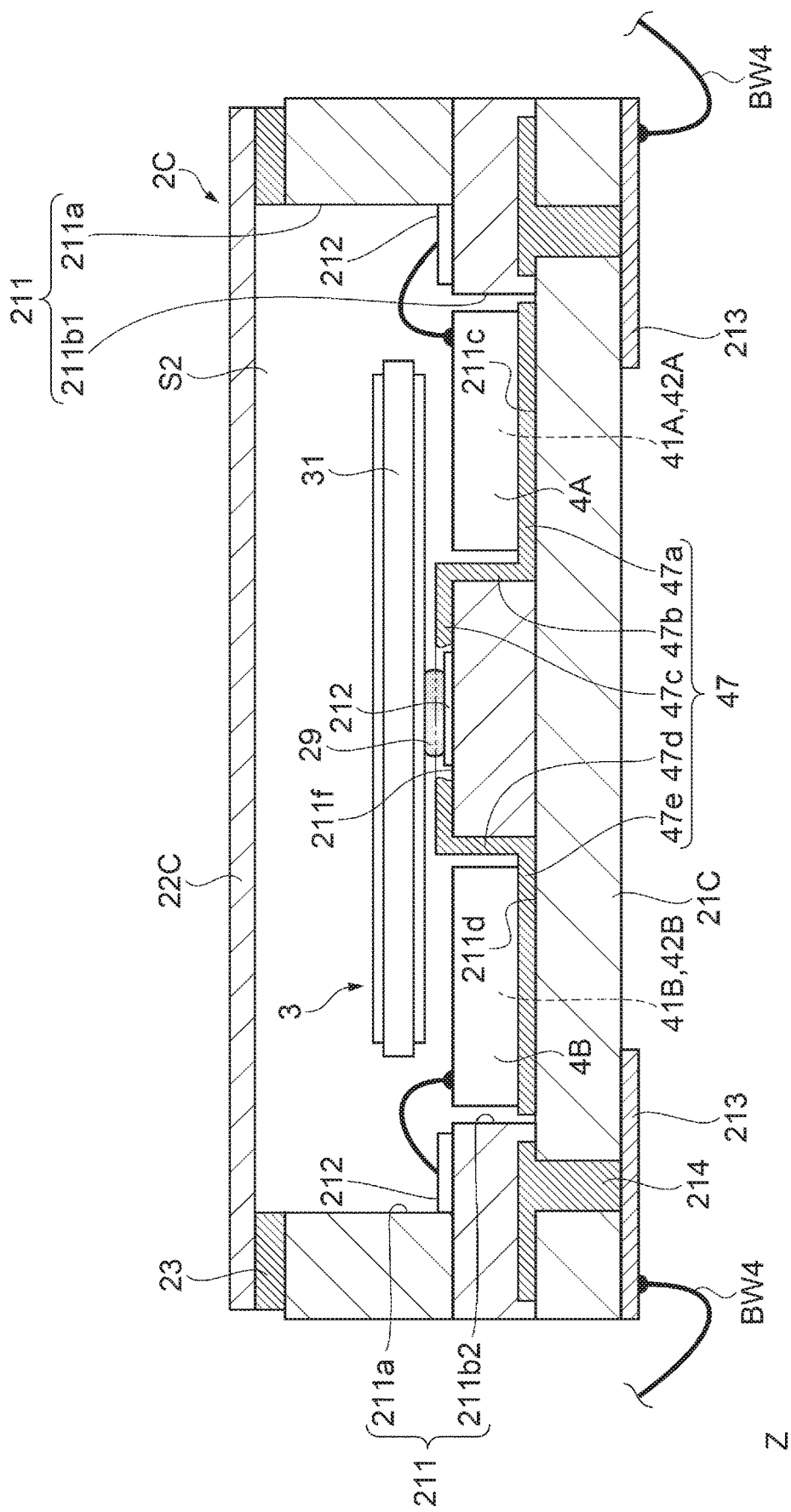
FIG. 15 is a cross-sectional view of a first package of the oscillator according to the fourth embodiment.
Figure 16:
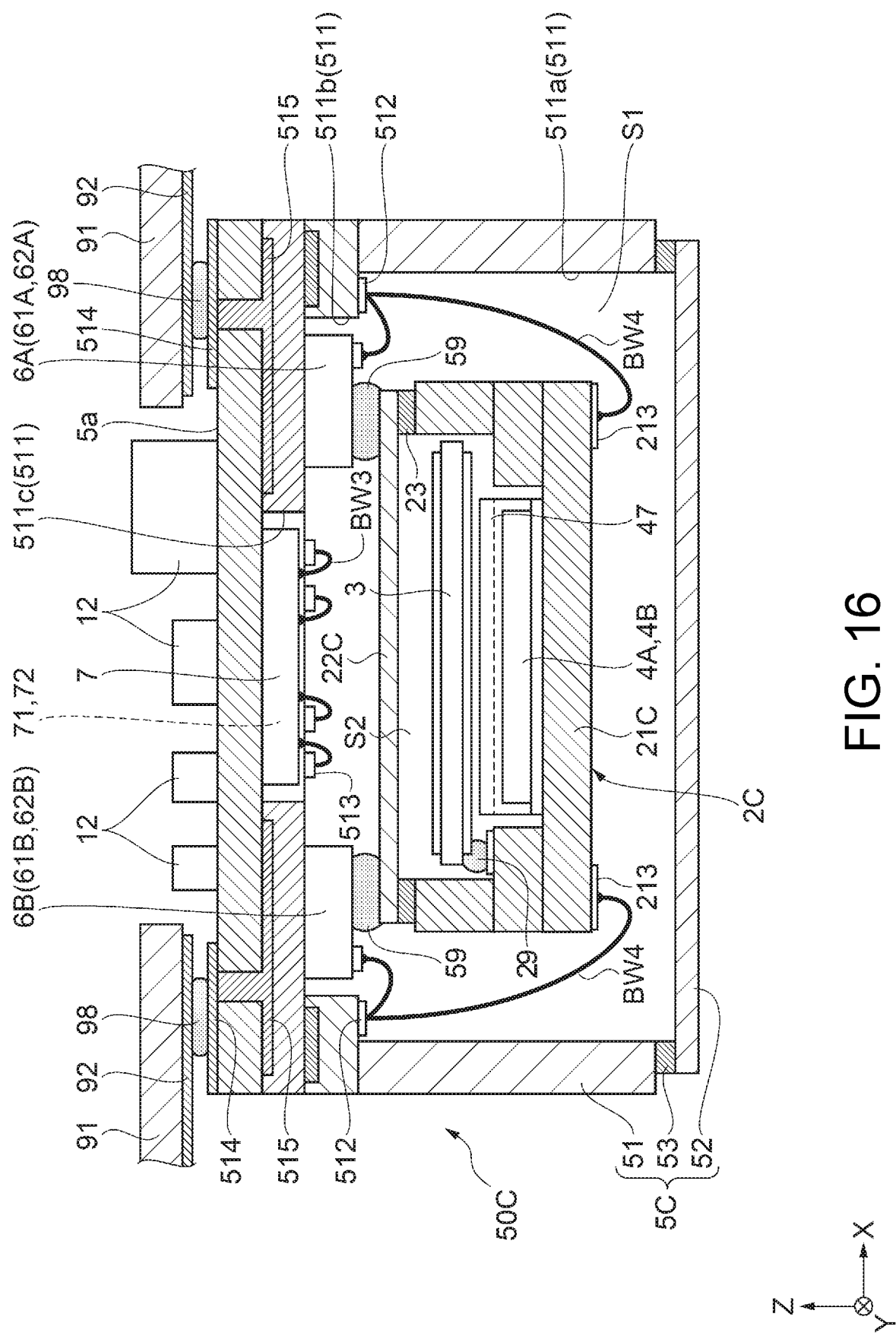
FIG. 16 is a cross-sectional view of a second package of the oscillator according to the fourth embodiment.

An oscillator that is an electronic part according to a fourth embodiment of the invention will next be described in detail with reference to FIGS. 14, 15, and 16. FIG. 14 is a cross-sectional view of the oscillator that is the electronic part according to the fourth embodiment of the invention. FIG. 15 a cross-sectional view of a first package of the oscillator according to the fourth embodiment. FIG. 16 is a cross-sectional view of a second package of the oscillator according to the fourth embodiment. The fourth embodiment will be described primarily on a configuration different from the configuration in the first embodiment described above, and the same configurations have the same reference character in the figures and will not be described in some cases.

An oscillator 1C according to the fourth embodiment shown in FIGS. 14, 15, and 16 is the same as the oscillator according to the first embodiment described above primarily except that a first package 2C, which is disposed in a second package 5C, is connected in a different direction. The direction in which the first package 2C, which is the different configuration is connected will be primarily described below.

The oscillator 1C according to the present embodiment includes the first package 2C, the second package 5C, and the third package 10, as shown in FIG. 14. The third accommodation space S3 in the third package 10 accommodates a structure 50C including the first package 2C and the second package 5C. The second package 5C and the third package 10 are the same as those in the first embodiment as described above and will therefore not be described in detail.

First Package

The first package 2C includes a first base 21C, on which the vibrator 3, the first heater 4A, and the second heater 4B are mounted, a first lid 22C, which is so bonded to the first base 21C that the second accommodation space S2, which accommodates the vibrator 3, the first heater 4A, and the second heater 4B, is provided between the first lid 22C and the first base 21C, and the frame-shaped seal ring 23, which is located between the first base 21C and the first lid 22C and bonds the first base 21C and the first lid 22C to each other, as shown in FIG. 15.

The first base 21C has the cavity 211, which opens in the −Z-axis direction, has the same configuration as that in the first embodiment, and is provided with the recess 211b1, in which the first heater 4A is disposed, and the recess 211b2, in which the second heater 4B is disposed.

On the other hand, the first lid 22C has a plate-like shape and is so bonded to the −Z-axis-direction-side end surface of the first base 21C via the seal ring 23 as to close the opening of the cavity 211. The first base 21C and the first lid 22C are hermetically bonded to each other when the seal ring 23 melts. The configuration in which the first lid 22C closes the opening of the cavity 211 allows formation of the second accommodation space S2, which can accommodate the vibrator 3, the first heater 4A, and the second heater 4B. The second accommodation space S2 of the hermetically sealed first package 2C has reduced pressure (lower than or equal to about 10 Pa, for example, but second accommodation space S2 is preferably vacuum space), as in the first embodiment.

First Heater and Second Heater

The first heater 4A and the second heater 4B, which serve as heat generators, are disposed in the recesses 211b1 and 211b2, which are provided in the first base 21C, which forms the first package 2C, respectively, as in the first embodiment. Specifically, the first heater 4A is disposed in the recess 211b1 as the first area, and the second heater 4B is disposed in the recess 211b2 as the second area different from the first area.

Heat Conducting Section

A first bottom plate 47a and a second bottom plate 47e, which are part of a heat conducting section 47, which serves as the first layer having a heat conducting function, are disposed between the bottom surface 211c of the recess 211b1 and the first heater 4A and between the bottom surface 211d of the recess 211b2 and the second heater 4B, respectively, as in the first embodiment. In other words, the heat conducting section 47 as the first layer is at least disposed between the first heater 4A and the first base 21C, which forms the first package 2C as the container, and between the second heater 4B and the first base 21C. The first heater 4A is fixed to the first bottom plate section 47a via an adhesive or any other component, and the second heater 4B is fixed to the second bottom plate section 47e via an adhesive or any other component. The heat conducting section 47, which is disposed between the first heater 4A and the first base 21C and between the second heater 4B and the first base 21C, can efficiently and reliably heat the heat conducting section 47, whereby non-uniformity of the temperature distribution of the entire heat conducting section 47 can be reduced.

The heat conducting section 47 includes a first bottom plate section 47a, which extends along the bottom surface 211c of the recess 211b1, a first wall section 47b, which is bent with respect to the first bottom plate section 47a in the Z-axis direction along a wall surface of the recess 211b1 or the wall surface facing the recess 211b2, the second bottom plate section 47e, which extends along the bottom surface 211d of the recess 211b2, a second wall section 47d, which is bent with respect to the second bottom plate section 47e in the Z-axis direction along a wall surface of the recess 211b2 or the wall surface facing the recess 211b1, and a top plate section 47c, which connects the first wall section 47b and the second wall section 47d to each other and extends along the bottom surface 211f of the first section 211a, as in the first embodiment. It is preferable that the heat conducting section 47 has an integrated structure and is made of a material having thermal conductivity higher than that of the first and second areas, for example, copper, a copper alloy, aluminum, or any other metal.

Second Package

In the oscillator 1C according to the present embodiment, the second package 5C is so disposed that the first lid 22C faces the third heater 6A and the fourth heater 6B and the first lid 22C is fixed to the third heater 6A and the second heater 6B, as shown in FIG. 16. That is, in the oscillator 1C according to the present embodiment, the first package 2C is disposed upside down in the Z-axis direction as compared with the configuration in the first embodiment described above. The first lid 22C can be made of Kovar or any other alloy as described above and can therefore have thermal conductivity higher than that of the first base 21C having the first and second areas in which the first heater 4A and the second heater 4B are disposed. The heat from the third heater 6A and the fourth heater 6B can therefore be efficiently transmitted to the first package 2C. Directly heating the first lid 22C, which has high thermal conductivity, by using the third heater 6A and the fourth heater 6B allows the circuit element 7 to be more efficiently heated. Further, since the heat from the first lid 22C is stably transmitted to the vibrator 3 via the first base 21C with no unevenness, whereby the temperature of the vibrator 3 can also be more precisely maintained at a fixed value.

The second base 51 has the plurality of inner terminals 512 disposed on the bottom surface of the first recess 511a, the plurality of inner terminals 513 disposed on the bottom surface of the second recess 511b, and the plurality of outer terminals 514 disposed on the bottom surface of the second base 51 (upper surface 5a of second package 5C). The inner terminals 512 are electrically connected to the outer terminals 213 of the first package 2C or the third heater 6A and the second heater 6B via the bonding wire BW4, and the inner terminals 513 are electrically connected to the circuit element 7 via the bonding wire BW3. The inner terminals 512 and 513 are electrically connected to each other via the internal wiring lines 515 disposed in the second base 51 and electrically connected to the outer terminals 514.

In the oscillator 1C according to the fourth embodiment described above, since the third heater 6A is disposed on the first lid 22C, which has thermal conductivity higher than those of the first and second areas, and connected to the first package 2C as the container via the first lid 22C, non-uniformity of the temperature distribution of the vibrator 3 can be further reduced. In the fourth embodiment, since the fourth heater 6B in addition to the third heater 6A is also disposed on the first lid 22C and connected to the first package 2C as the container via the first lid 22C, the vibrator 3 can be heated at further higher efficiency, and non-uniformity of the temperature distribution of the vibrator 3 can be further reduced.

Fifth Embodiment

Figure 17:
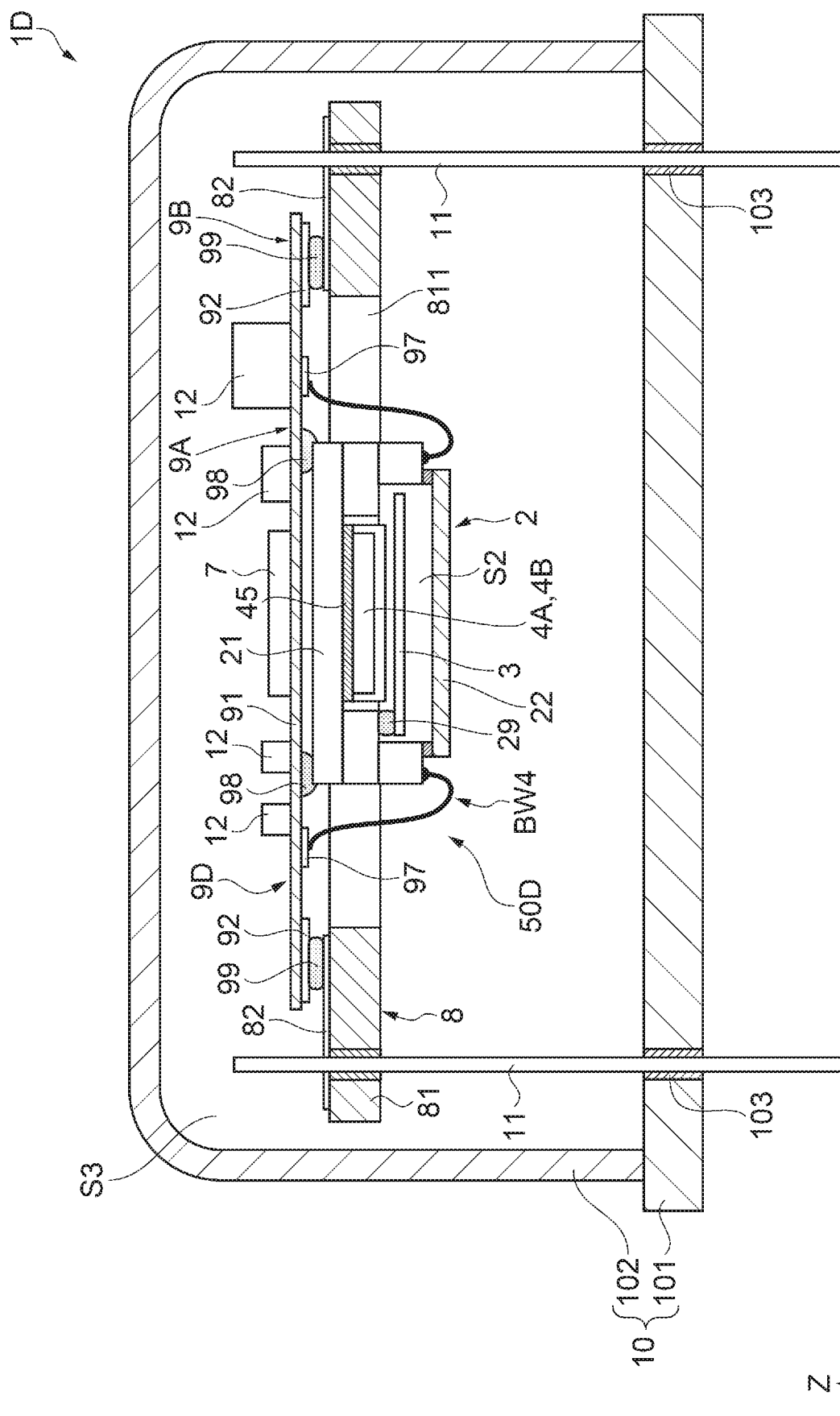
FIG. 17 is a cross-sectional view of an oscillator that is an electronic part according to a fifth embodiment of the invention.

An oscillator that is an electronic part according to a fifth embodiment of the invention will next be described in detail with reference to FIG. 17. FIG. 17 is a cross-sectional view of the oscillator that is the electronic part according to the fifth embodiment of the invention. The fifth embodiment will be described below primarily on a configuration different from the configuration in the first embodiment described above, and the same configurations as those in the first embodiment have the same reference character in the figure and will not be described in some cases.

An oscillator 1D according to the fifth embodiment shown in FIG. 17 primarily differs from the oscillator 1 according to the first embodiment described above in that the configuration of a structure 50D differs from the configuration of the structure 50. The oscillator 1D is the same as the oscillator 1 according to the first embodiment described above except the configuration of the structure 50D, and the configuration of the structure 50D, which is the different configuration, will be primarily described below.

The oscillator 1D according to the fifth embodiment includes the first package 2 as the container, the vibrator 3 accommodated in the first package 2, the first heater 4A and the second heater 4B as heat generators, the wiring substrate 8, and a flexible substrate 9D, which supports the first package 2 and is connected to the wiring substrate 8, as shown in FIG. 17. The oscillator 1D further includes the circuit element 7 and the circuit parts 12 connected to a surface of the flexible substrate 9D or the surface opposite the side to which the first package 2 is connected. The configuration including the first package 2, the flexible substrate 9D, to which the first package 2 is connected, and the wiring substrate 8, to which the flexible substrate 9D is connected, forms the structure 50D.

The structure 50D (wiring substrate 8, flexible substrate 9D, and first package 2) is accommodated in the third accommodation space S3 of the third package 10 via the wiring substrate 8 electrically connected and fixed to the plurality of pins 11, which are so provided as to pass through the third package 10. In the fifth embodiment, the configurations of the first package 2, the third package 10, and the wiring substrate 8 are the same as those in the first embodiment and will therefore not be described in detail.

The flexible substrate 9D supports the first package 2 and is connected to the wiring substrate 8. The flexible substrate 9D and the first package 2 are fixed to each other via the electrically conductive fixing member 98, and the flexible substrate 9D and the wiring substrate 8 are fixed to each other via the electrically conductive fixing member 99. The thus configured flexible substrate 9D can be formed of a known flexible printed circuit board and includes the flexible sheet-shaped (film-shaped) base section 91 and wiring lines 92 and 97 disposed on the base section 91.

The base section 91 has a sheet-like shape and has the package mounting area 9A, which is set in a central portion of the base section 91, and the wiring substrate connecting area 9B, which is set in the periphery of the base section 91. The first package 2 is connected to the package mounting area 9A and connected to the wiring substrate 8 in the wiring substrate connecting area 9B. The wiring lines 92 in the package mounting area 9A are electrically connected to the outer terminals (not shown) of the first package 2 via the fixing member 98, and the wiring lines 92 in the wiring substrate connecting area 9B are electrically connected to the wiring lines 82 via the fixing member 99. The wiring lines 97 are electrically connected to the outer terminal 213 (see FIG. 2) of the first package 2 via the bonding wires BW4.

The thus configured flexible substrate 9D has flexibility and is therefore deformable in accordance with thermal expansion of the first package 2 and the wiring substrate 8. Stress is therefore unlikely to be induced in the portions where the flexible substrate 9D is bonded to the first package 2 and the wiring substrate 8, resulting in improvement in the reliability of the mechanical and electrical connection between the first package 2 and the flexible substrate 9D and between the wiring substrate 8 and the flexible substrate 9D. In particular, in the case where the temperatures of the circuit element 7 and the vibrator 3 are controlled by the first heater 4A and the second heater 4B, the temperatures of the circuit element 7 and the vibrator 3 greatly differ between the state in which the oscillator 1D is powered on and the state in which the oscillator 1D is powered off, and a larger amount of deformation due to thermal expansion occurs than in an oscillator that does not include the first heater 4A or the second heater 4B. However, even in this case, the oscillator 1D can operate in a reliable manner. Further, in a case where impact acts on the oscillator 1D, the flexible substrate 9D can absorb and reduce the impact, whereby the possibility of damage of the circuit element 7 and the vibrator 3 can be further reduced.

The circuit element 7 includes at least part of the oscillation circuit that causes the oscillator element (vibrator 3) to vibrate and is disposed in a position facing the heat conducting section 45, which serves as the first layer provided in the first package 2, in the plan view of the first package 2. The arrangement of the circuit element 7 described above shortens the distance between the circuit element 7 and the heat conducting section 45 (first heater 4A and the second heater 4B) and allows the entire flat surface of the circuit element 7 to overlap with the heat conducting section 45 (first heater 4A and the second heater 4B), whereby the first heater 4A and the second heater 4B can efficiently heat the circuit element 7 with no unevenness.

In the oscillator 1D according to the fifth embodiment described above, since the first heater 4A, the second heater 4B, and the heat conducting section 45 are disposed in the first base 21, which forms the first package 2, the heat conducting section 45 can be efficiently and reliably heated, whereby what is called a "thermostat function" of keeping the temperature of the entire heat conducting section 45 roughly constant can be further enhanced. Non-uniformity of the temperature distributions of the vibrator 3 and the circuit element 7 (temperature unevenness) can therefore be reduced, whereby an oscillator 1D having a stabilized resonance frequency can be provided.

In the embodiments described above, in the first packages 2, 2A, 2B, and 2C, the heat conducting sections 45, 46, and 47 are disposed on the side facing the first bases 21 and 21C or the side facing the vibrator 3 with respect to the first heater 4A and the second heater 4B, but not necessarily. The heat conducting section 45, 46, and 47 can instead be disposed on both sides of the first heater 4A and the second heater 4B, the side facing the first bases 21 and 21C and the side facing the vibrator 3.

Electronic Apparatus

Figure 18:
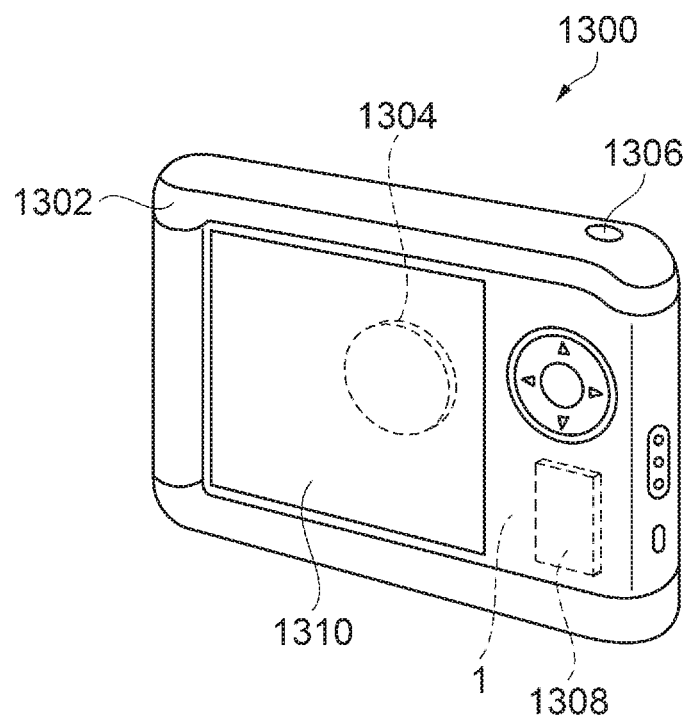
FIG. 18 is a perspective view showing a digital still camera as an electronic apparatus according to an embodiment of the invention.

An electronic apparatus including any of the oscillators 1, 1A, 1B, 1C, and 1D according to the embodiments of the invention will next be described with reference to a digital still camera shown in FIG. 18. FIG. 18 is a perspective view showing a digital still camera as the electronic apparatus according to an embodiment of the invention. The following description will be made with reference to a case where the oscillator 1 is used.

As shown in FIG. 18, a display 1310 is provided on the rear side of a case (body) 1302 of a digital still camera 1300 and performs display operation based on a captured image signal from a CCD. The display 1310 thus functions as a finder that displays a subject in the form of an electronic image. Further, a light receiving unit 1304 including an optical lens (imaging system), the CCD, and other components is provided on the front side (rear side in FIG. 18) of the case 1302. When a user who uses the camera for photography checks a subject image displayed on the display 1310 and presses a shutter button 1306, a captured image signal from the CCD at that point of time is transferred to and stored in a memory 1308. The oscillator 1 is built in the thus configured digital still camera 1300.

The digital still camera 1300 described above as the electronic apparatus, which includes the oscillator 1, can provide the effects provided by the oscillator 1 described above and therefore achieve excellent reliability, in particular, an excellent temperature characteristic.

The electronic apparatus according to the embodiment of the invention is not limited to the digital still camera 1300 shown in FIG. 18 and can, for example, be a personal computer, a mobile phone, a smartphone, a tablet terminal, a timepiece (including smartwatch), an inkjet-type liquid ejection apparatus (inkjet printer, for example), a laptop personal computer, a television receiver, an HMD (head mounted display) and other wearable terminals, a video camcorder, a video tape recorder, a car navigator, a pager, an electronic notebook (including electronic notebook having communication capability), an electronic dictionary, a desktop calculator, an electronic game console, a word processor, a workstation, a TV phone, a security television monitor, electronic binoculars, a POS terminal, a medical apparatus (for example, electronic thermometer, blood pressure gauge, blood sugar meter, electrocardiograph, ultrasonic diagnostic apparatus, and electronic endoscope), a fish finder, a variety of measuring apparatus, an apparatus for a mobile terminal/base station, a variety of instruments (for example, instruments in vehicles, airplanes, and ships), a flight simulator, a network server, a head mounted display, a motion tracer, a motion tracker, a motion controller, a PDR (pedestrian dead reckoning) apparatus, or any other electronic apparatus. Any of the oscillators 1, 1A, 1B, 1C, and 1D described above can be used to maintain a constant temperature state and is therefore suitable for an electronic apparatus used under a harsh temperature environment condition, such as a communication base station.

The oscillators 1, 1A, 1B, 1C, and 1D according to the embodiments of the invention can also be used in a vehicle. The following description will be made with reference to the case where the oscillator 1 is used. Specifically, the following description will be made with reference to a case where the oscillator 1 according to one of the embodiments of the invention is used in an automobile as an example of the vehicle.

The automobile incorporates an electronic control unit (ECU) in which the oscillator 1 is built in and which controls the attitude of the automobile body and the output of the engine. In addition, the oscillator 1 can be widely used with an automobile body attitude control unit, an anti-lock braking system (ABS), an airbag, and a tire pressure monitoring system (TPMS).

The attitude control using the built-in oscillator 1 can further be used, for example, in a robot apparatus, such as a bipedal walking robot, and a radio-controlled helicopter, which can be presented as other examples of the vehicle.

The vehicle described above uses the oscillator 1 that maintains a constant temperature state and can therefore achieve high reliability even when used under a condition in which the vehicle is used in a harsh temperature environment.

The aforementioned embodiments have been described with reference to the configuration in which the quartz crystal vibrator 3 is used as the oscillator element, but the oscillator element is not limited to the quartz crystal vibrator 3, and a piezoelectric vibrator using an oxide substrate made, for example, of aluminum nitride (AlN), lithium niobate ($LiNbO_3$), lithium tantalate ($LiTaO_3$), lead zirconate titanate (PZT), lithium tetraborate ($Li_2B_4O_7$), langasite crystal ($La_3Ga_5SiO_{14}$), potassium niobate ($KNbO_3$), gallium phosphate ($GaPO_4$), gallium arsenide (GaAs), zinc oxide (ZnO, $Zn_2O_3$), barium titanate ($BaTiO_3$), lead titanate ($PbPO_3$), sodium potassium niobate (($K,Na)NbO_3$), bismuth ferrite ($BiFeO_3$), sodium niobate ($NaNbO_3$), bismuth titanate ($Bi_4Ti_3O_{12}$), or bismuth sodium titanate ($Na_{0.5}Bi_{0.5}TiO_3$), a laminate piezoelectric substrate formed by layering aluminum nitride, tantalum pentoxide ($Ta_2O_5$), or any other piezoelectric material on a glass substrate, or a piezoelectric ceramic material can be used. Further, a vibrator formed of a piezoelectric element disposed on a silicon substrate can also be used. The quartz crystal vibrator is not limited to an SC-cut vibrator and may, for example, be an AT-cut, BT-cut, Z-cut, or LT-cut vibrator.

The aforementioned embodiments have been described with reference to the configuration in which the third heater 6A and the fourth heater 6B are disposed in the second package 5, 5B, and 5C. Instead, at least one of the third heater 6A and the fourth heater 6B may be omitted, or another heater may further be disposed.

The embodiments described above have been presented by way of example, and the invention is not limited thereto. For example, the embodiments, application examples, and variations can be combined with each other as appropriate.

The invention encompasses substantially the same configuration as the configuration described in each of the embodiments (for example, a configuration having the same function, using the same method, and providing the same result or a configuration having the same purpose and providing the same effect). Further, the invention encompasses a configuration in which an inessential portion of the configuration described in each of the embodiments is replaced. Moreover, the invention encompasses a configuration that provides the same advantageous effects as those provided by the configuration described in each of the embodiments or a configuration that can achieve the same purpose as that achieved by the configuration described in each of the embodiments. Further, the invention encompasses a configuration in which a known technology is added to the configuration described in each of the embodiments.

The entire disclosure of Japanese Patent Application No.: 2017-098737, filed May 18, 2017 and 2017-205859, filed Oct. 25, 2017 are expressly incorporated by reference herein.

What is claimed is:

1. An oscillator comprising:
a container;
a first heater disposed in a first area of the container;
a second heater disposed in a second area of the container that is different from the first area;
a vibrator disposed between the first area and the second area when viewed in a direction perpendicular to a surface on which the first heater is disposed; and
a layer that is disposed between the vibrator and the container, overlapping with the first heater, the second heater, and the vibrator when viewed in the direction perpendicular to the surface,
wherein thermal conductivity of the layer is higher than thermal conductivity of the first and second areas.

2. The oscillator according to claim 1,
wherein the container is provided with a recess, and
the first heater is so disposed in the recess as to overlap with at least part of the vibrator when viewed in the direction perpendicular to the surface.

3. The oscillator according to claim 1,
wherein the container is provided with a recess, and
the second heater is so disposed in the recess as to overlap with at least part of the vibrator when viewed in the direction perpendicular to the surface.

4. The oscillator according to claim 1,
wherein the layer is disposed between the first heater and the container and between the second heater and the container.

5. The oscillator according to claim 1,
wherein the layer is disposed between the first heater and the vibrator and between the second heater and the vibrator.

6. The oscillator according to claim 1, further comprising:
a second container that accommodates the container; and
a third heater disposed in the second container and connected to the container.

7. The oscillator according to claim 6,
wherein the container includes a first lid having thermal conductivity higher than thermal conductivity of the first and second areas, and
the third heater is connected to the first lid.

8. The oscillator according to claim 6, further comprising a second layer having thermal conductivity higher than thermal conductivity of at least part of the second container,
wherein the third heater is connected to the container via the second layer.

9. An electronic apparatus comprising an oscillator including
a container,
a first heater disposed in a first area of the container,
a second heater disposed in a second area of the container that is different from the first area,
a vibrator disposed between the first area and the second area when viewed in a direction perpendicular to a surface on which the first heater is disposed, and
a layer that is disposed between the vibrator and the container, overlapping with the first heater, the second heater, and the vibrator when viewed in the direction perpendicular to the surface,
wherein thermal conductivity of the layer is higher than thermal conductivity of the first and second areas.

* * * * *